(12) United States Patent
Eguchi

(10) Patent No.: US 9,362,287 B2
(45) Date of Patent: Jun. 7, 2016

(54) SEMICONDUCTOR DEVICE AND METHOD FOR MANUFACTURING THE SAME

(71) Applicant: Cypress Semiconductor Corporation, San Jose, CA (US)

(72) Inventor: Akira Eguchi, Akiruno (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/539,410

(22) Filed: Nov. 12, 2014

(65) Prior Publication Data

US 2016/0133629 A1　May 12, 2016

(51) Int. Cl.
| | | |
|---|---|---|
| *H01L 27/092* | (2006.01) | |
| *H01L 21/8238* | (2006.01) | |
| *H01L 29/06* | (2006.01) | |
| *H01L 21/3205* | (2006.01) | |
| *H01L 21/265* | (2006.01) | |
| *H01L 21/266* | (2006.01) | |

(52) U.S. Cl.
CPC .......... *H01L 27/0928* (2013.01); *H01L 21/266* (2013.01); *H01L 21/26513* (2013.01); *H01L 21/32053* (2013.01); *H01L 21/823878* (2013.01); *H01L 21/823892* (2013.01); *H01L 29/0642* (2013.01)

(58) Field of Classification Search
CPC .................. H01L 29/6659; H01L 21/823807; H01L 29/6656; H01L 21/823814; H01L 29/7833; H01L 29/665

USPC .......................................................... 257/372
See application file for complete search history.

(56) References Cited

U.S. PATENT DOCUMENTS

| | | | | |
|---|---|---|---|---|
| 5,336,637 A | * | 8/1994 | Nowak ................ | H01L 27/0925 148/DIG. 103 |
| 8,101,479 B2 | * | 1/2012 | Parker ............... | H01L 21/26513 257/E21.435 |
| 8,164,155 B2 | * | 4/2012 | Kang ................. | H01L 21/76224 257/499 |
| 8,482,094 B2 | * | 7/2013 | Oh .................... | H01L 21/76229 257/500 |
| 2012/0007207 A1 | * | 1/2012 | Salcedo ............. | H01L 27/0259 257/491 |

* cited by examiner

*Primary Examiner* — Tod T Van Roy
*Assistant Examiner* — Vu A Vu

(57) ABSTRACT

A semiconductor device includes: a first transistor and a second transistor disposed in or on a silicon substrate; an element isolation structure that isolates the first transistor and the second transistor, the element isolation structure comprising at least one of a first element isolation film disposed in a region of a first well disposed in a formation area of the first transistor, or a second element isolation film disposed in a region of a second well disposed in a formation area of the second transistor, and a third well disposed under the first well in the silicon substrate and is electrically connected to the second well. The first element isolation film or the second element isolation film has a portion that does not extend over a boundary between the first well and the second well.

12 Claims, 46 Drawing Sheets

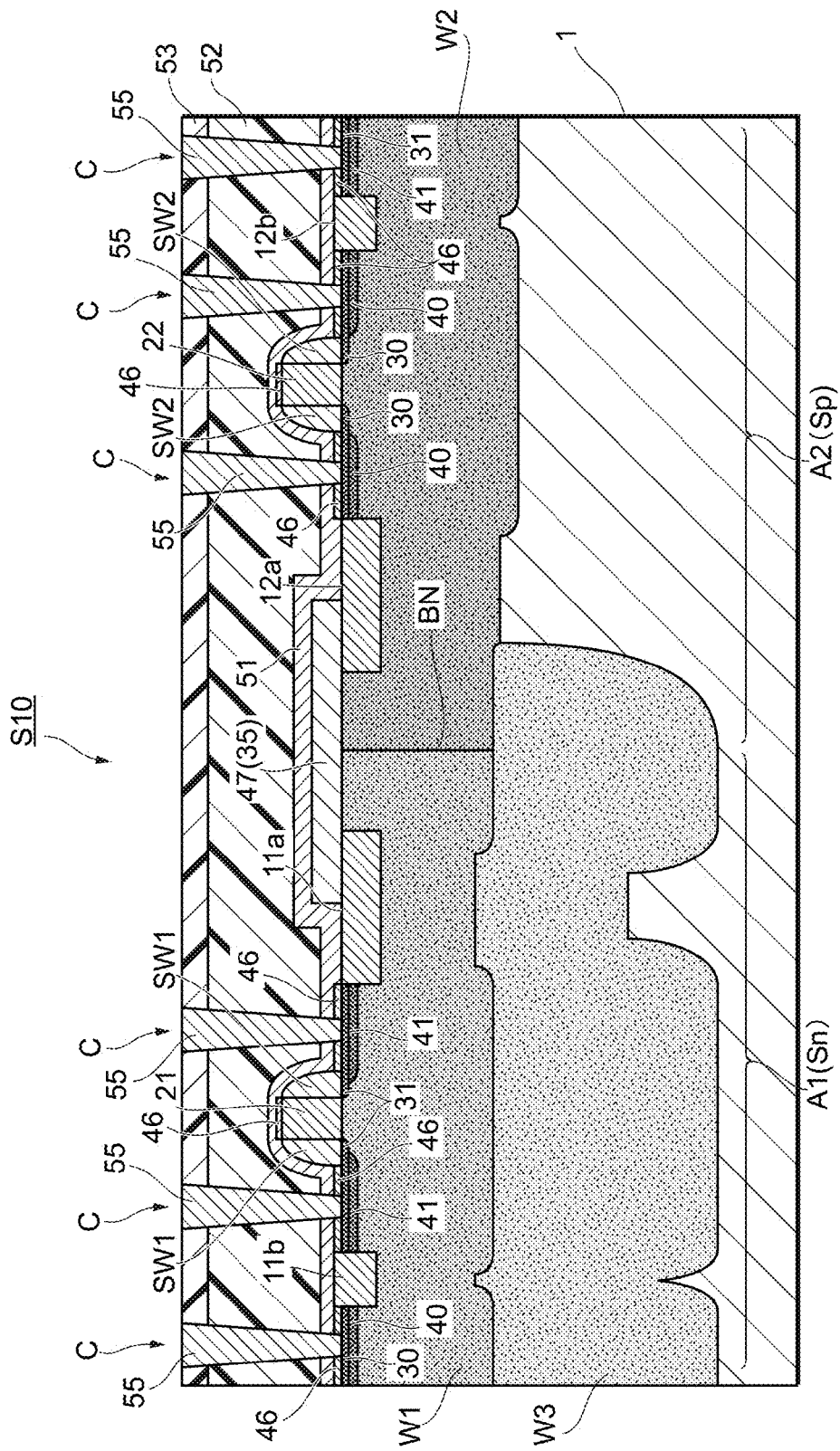

SEMICONDUCTOR DEVICE AND METHOD FOR MANUFACTURING THE SAME

BACKGROUND

A triple-well structure in a semiconductor device generally includes a "shallow P well" (high-voltage P well) and a "shallow N well" (high-voltage N well) formed in a P-type silicon substrate, and a "deep N well" that is formed under the shallow P well and is electrically connected to the shallow N well (as in, for example, Japanese Patent Application JP H11-261022 A).

A semiconductor device having a triple-well structure generally is formed by the following manufacturing process. Element isolation is performed by a shallow trench isolation (STI) technique or the like between an N-type transistor formation area and a P-type transistor formation area in a P-type silicon substrate. Next, a half part of the element isolation film located on the P-type transistor formation area side is covered with a resist mask, and boron ions, for example, are implanted at a part of the surface layer of the N-type transistor formation area, thus forming a shallow P well. Subsequently, phosphorous ions, for example, are implanted through the P well using the same resist mask at a part under the P well, thus forming a deep N well. After removing the resist mask, a half part of the element isolation film located on the N-type transistor formation area side is covered with a resist mask, and phosphorus ions, for example, are implanted at a part of the surface layer of the P-type transistor formation area, thus forming a shallow N well. The deep N well and the shallow N well are thereby electrically connected, and the shallow P well and the P-type silicon substrate are insulated electrically. In this way, a triple-well structure formed by this manufacturing process includes an element isolation film that extends over the boundary between the shallow P well and the shallow N well.

However, this triple-well structure may have difficulty in lowering the resistance at the connection part of the "shallow N well" and the "deep N well," and tends to generate latchup due to a parasitic transistor generated by the manufacturing process.

SUMMARY

Provided herein are semiconductor device and manufacturing method embodiments, and/or combinations and subcombinations thereof, which are capable of reinforcing a connection between wells in a triple-well structure, capable of lowering resistance at the connection part, and capable of improving latch-up immunity.

An embodiment includes a semiconductor device comprising a first transistor and a second transistor disposed in or on a silicon substrate; an element isolation structure that isolates the first transistor and the second transistor, the element isolation structure comprising at least one of a first element isolation film disposed in a region of a first well disposed in a formation area of the first transistor, or a second element isolation film disposed in a region of a second well disposed in a formation area of the second transistor, and a third well disposed under the first well in the silicon substrate and is electrically connected to the second well, wherein the first element isolation film or the second element isolation film has a portion that does not extend over a boundary between the first well and the second well.

Another embodiment includes a method for manufacturing a semiconductor device comprising preparing a silicon substrate; forming an element isolation structure on the silicon substrate that isolates the first transistor and the second transistor, the element isolation structure comprising at least one of a first element isolation film disposed in a region of a first well which is formed in a formation area of the first transistor, or a second element isolation film disposed in a region of a second well which is formed in a formation area of the second transistor; covering the region of the second well with a second mask; forming a first well by implanting ions into the region of the first well; forming a third well by implanting ions under the first well; removing the second mask; covering the region of the first well with a first mask; forming a second well by implanting ions into the region of the second well, wherein the third well is connected to the second well; and removing the first mask, wherein the first element isolation film or the second element isolation film is formed so as to have a portion that does not extend over a boundary between the first well and the second well.

BRIEF DESCRIPTION OF THE DRAWINGS

The accompanying drawings are incorporated herein and form a part of the specification.

FIGS. 39 to 46 illustrate an example process flow (cross-sectional view corresponding to FIG. 10B) to show the manufacturing state of an example semiconductor device according to the tenth embodiment.

In the drawings, like reference numbers generally indicate identical or similar elements. Additionally, generally, the leftmost digit(s) of a reference number identifies the drawing in which the reference number first appears.

DETAILED DESCRIPTION

First Embodiment

Referring to FIGS. 1A, 1B, and 14-26, the following describes the structure of a semiconductor device S1 according to a first embodiment and the procedure in the manufacturing method therefor. In the following description of the first embodiment, as well as of the other embodiments, various processes performed such as film formation and patterning may be well-known appropriate physical and/or chemical techniques unless otherwise specified.

Figure 1:
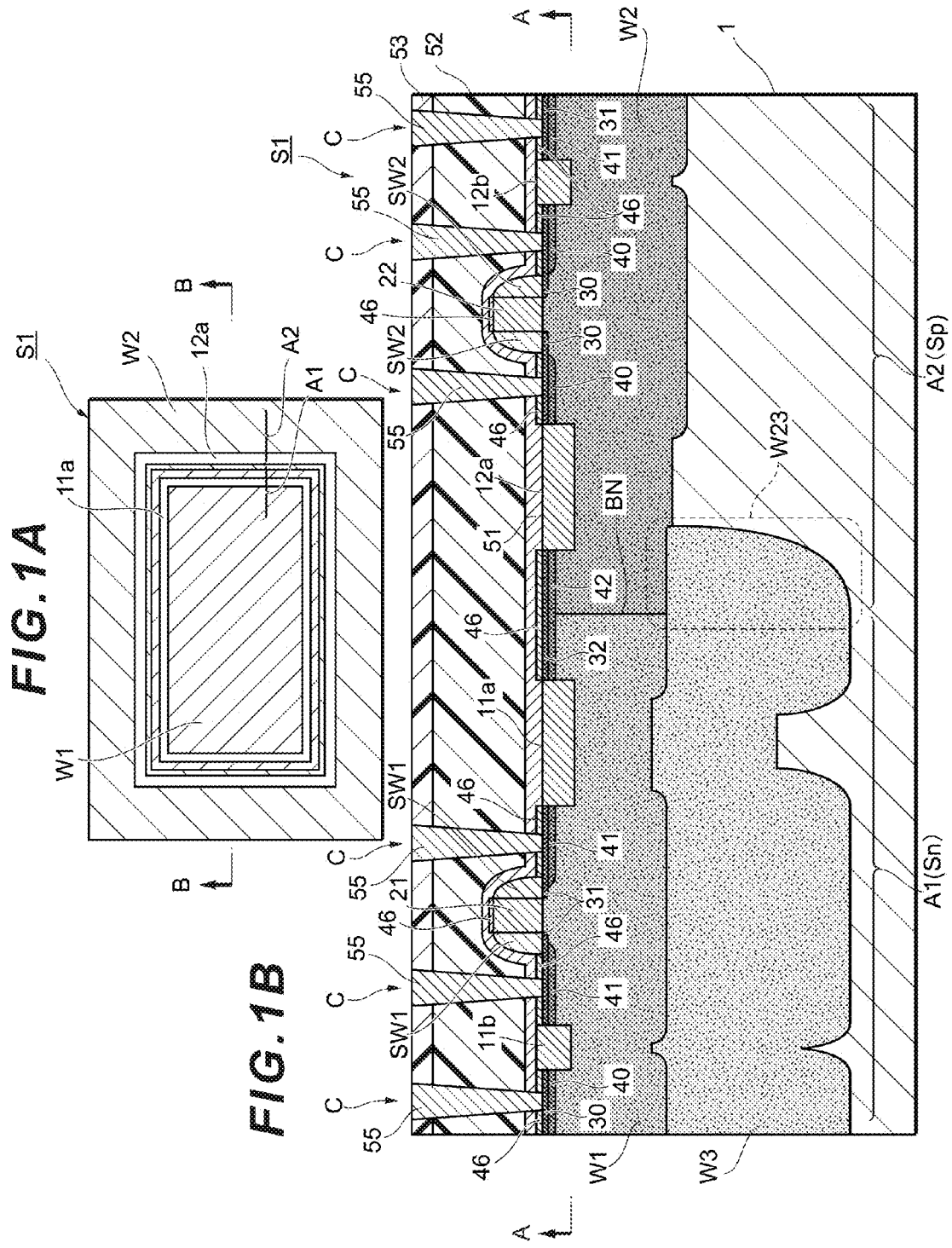
FIGS. 1A and 1B are a plan view and a cross-sectional view, respectively, schematically showing the structure of an example semiconductor device according to a first embodiment.
Figure 2:
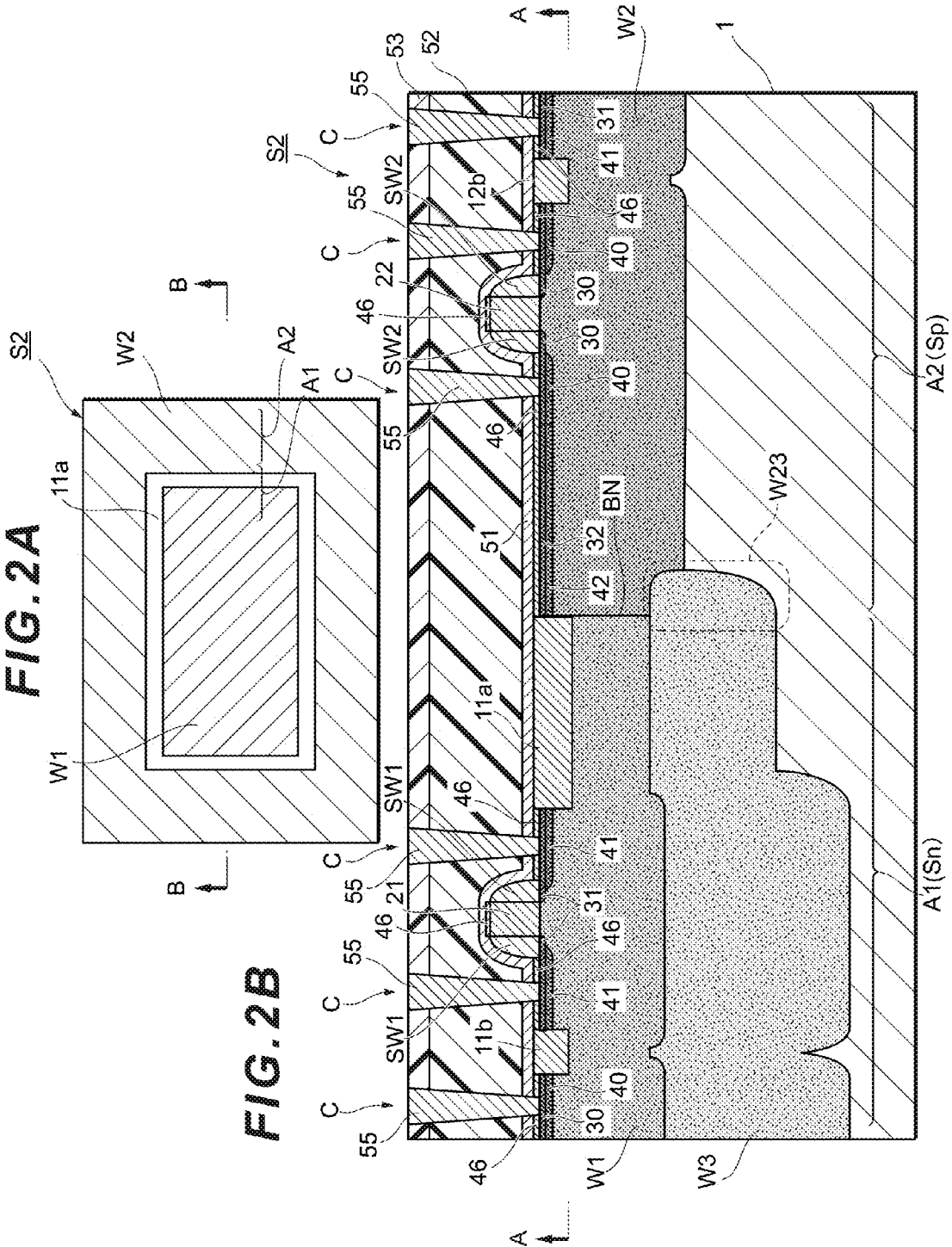
FIGS. 2A and 2B are a plan view and a cross-sectional view, respectively, schematically showing the structure of an example semiconductor device according to a second embodiment.
Figure 3:
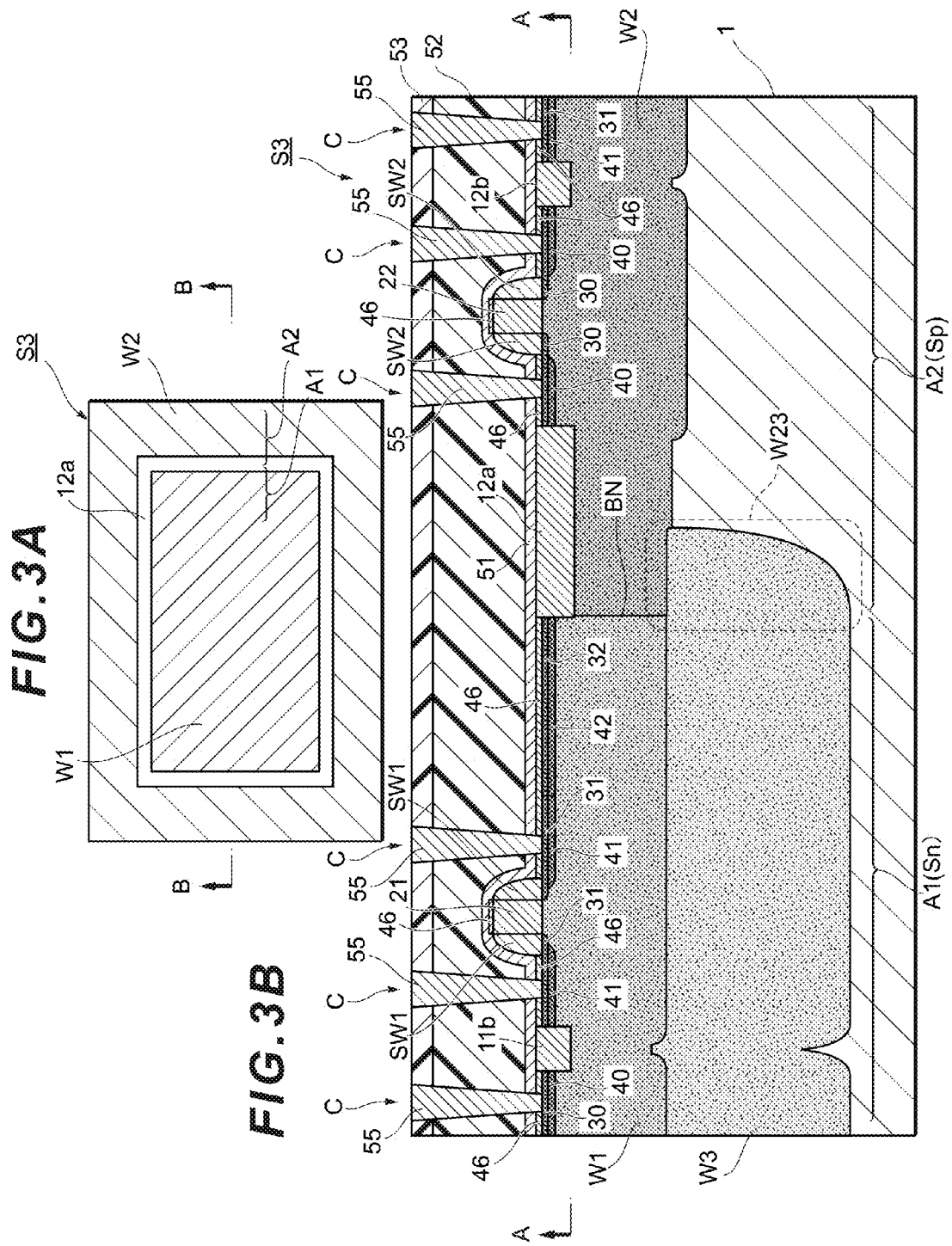
FIGS. 3A and 3B are a plan view and a cross-sectional view, respectively, schematically showing the structure of an example semiconductor device according to a third embodiment.
Figure 4:
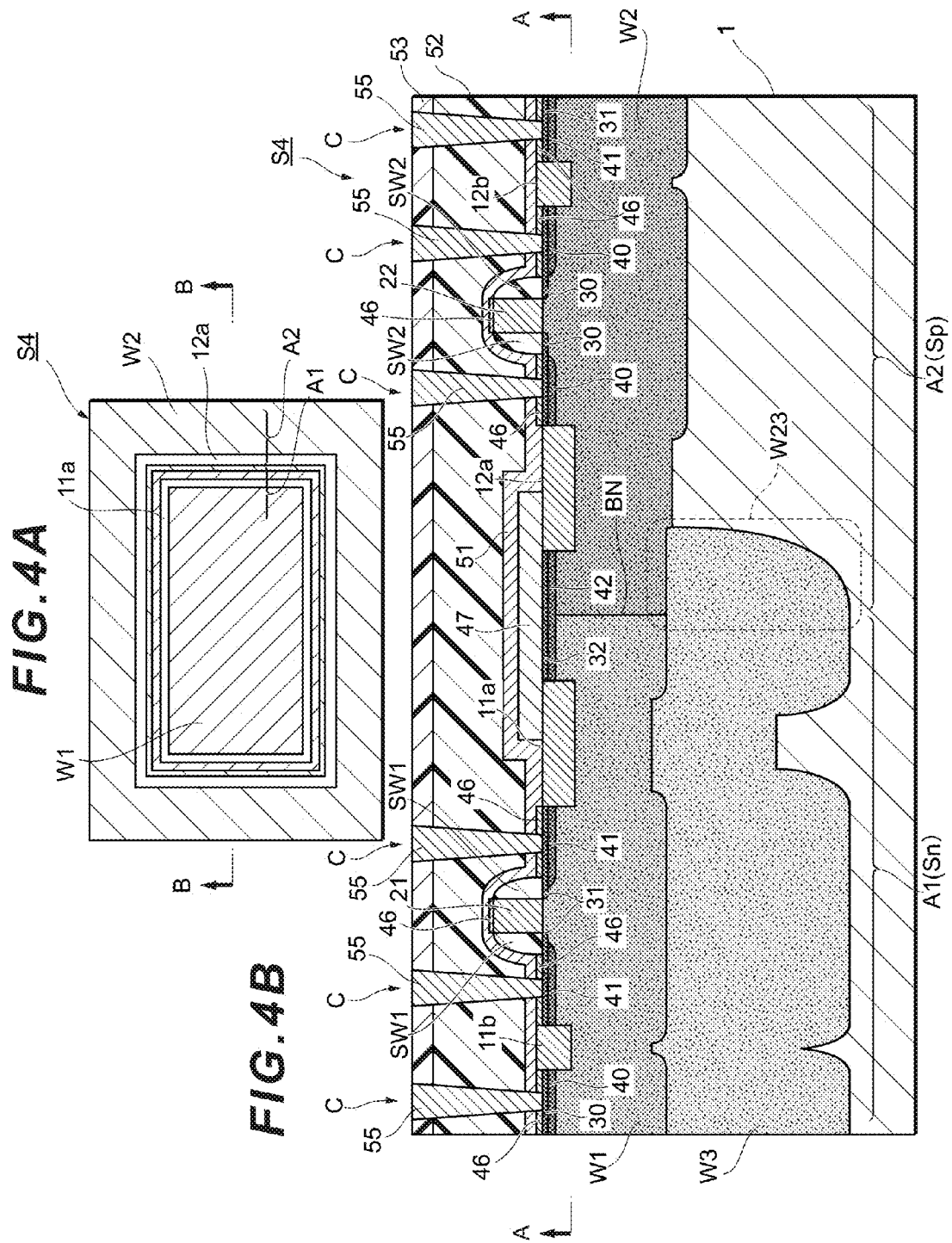
FIGS. 4A and 4B are a plan view and a cross-sectional view, respectively, schematically showing the structure of an example semiconductor device according to a fourth embodiment.
Figure 5:
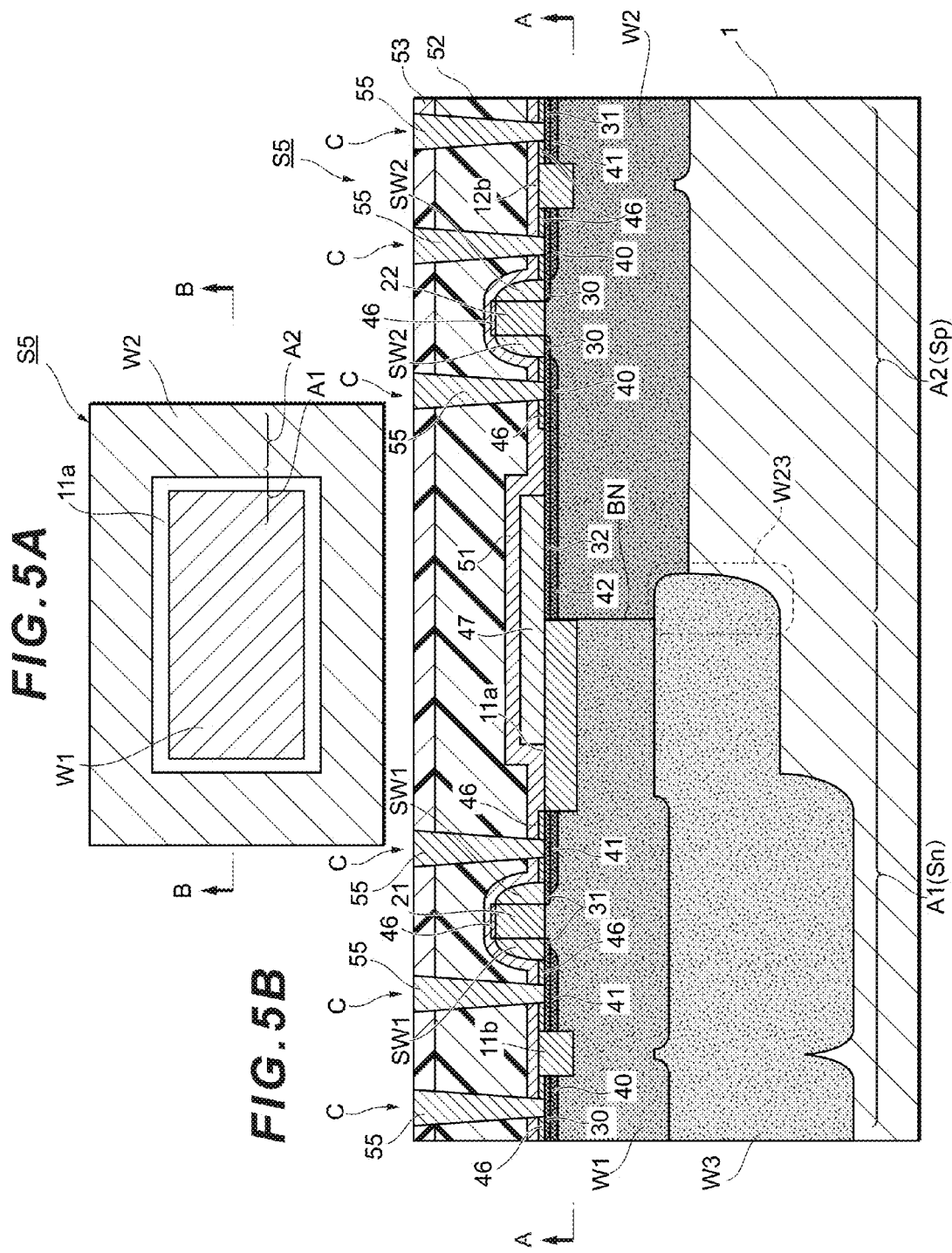
FIGS. 5A and 5B are a plan view and a cross-sectional view, respectively, schematically showing the structure of an example semiconductor device according to a fifth embodiment.
Figure 6:
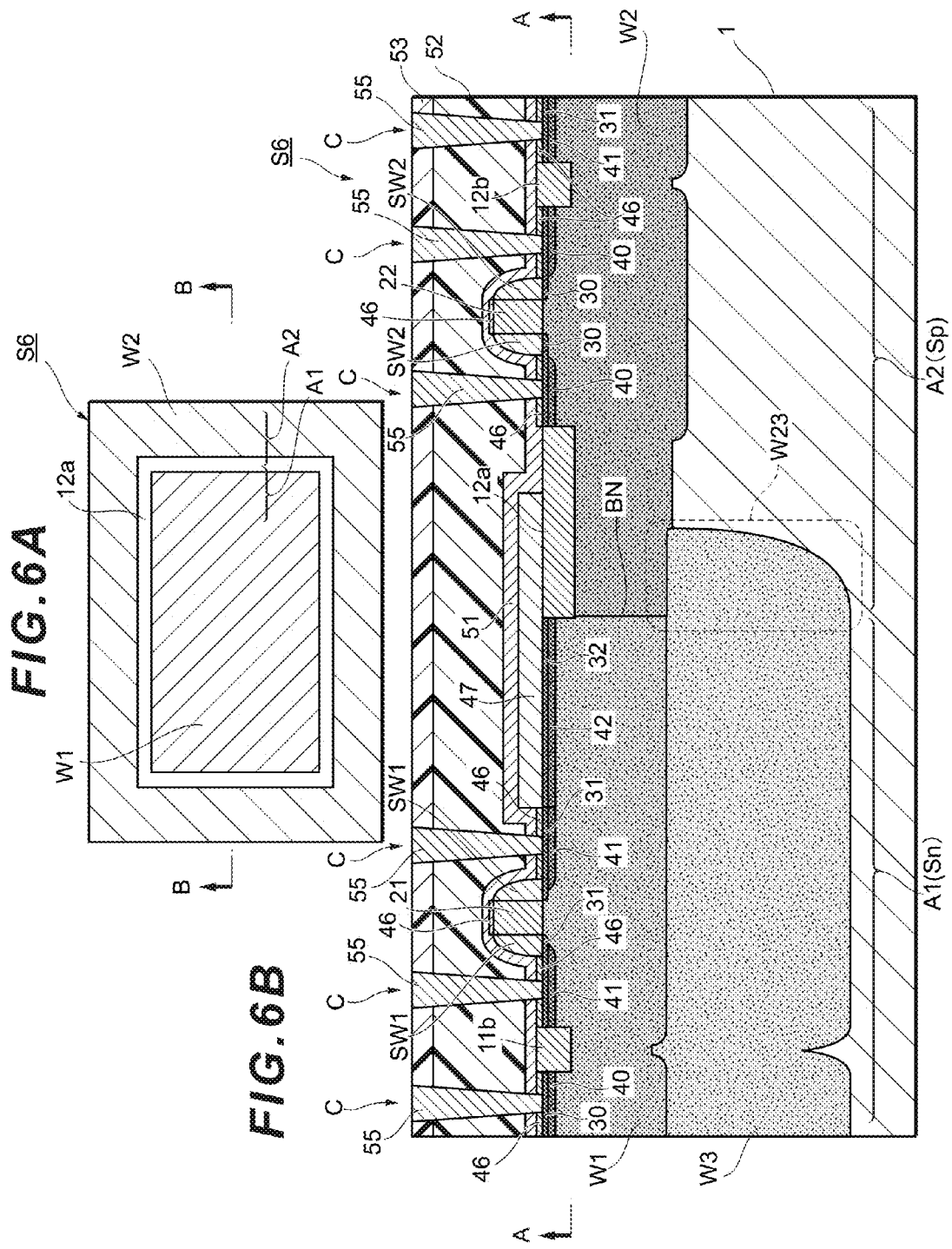
FIGS. 6A and 6B are a plan view and a cross-sectional view, respectively, schematically showing the structure of an example semiconductor device according to a sixth embodiment.
Figure 7:
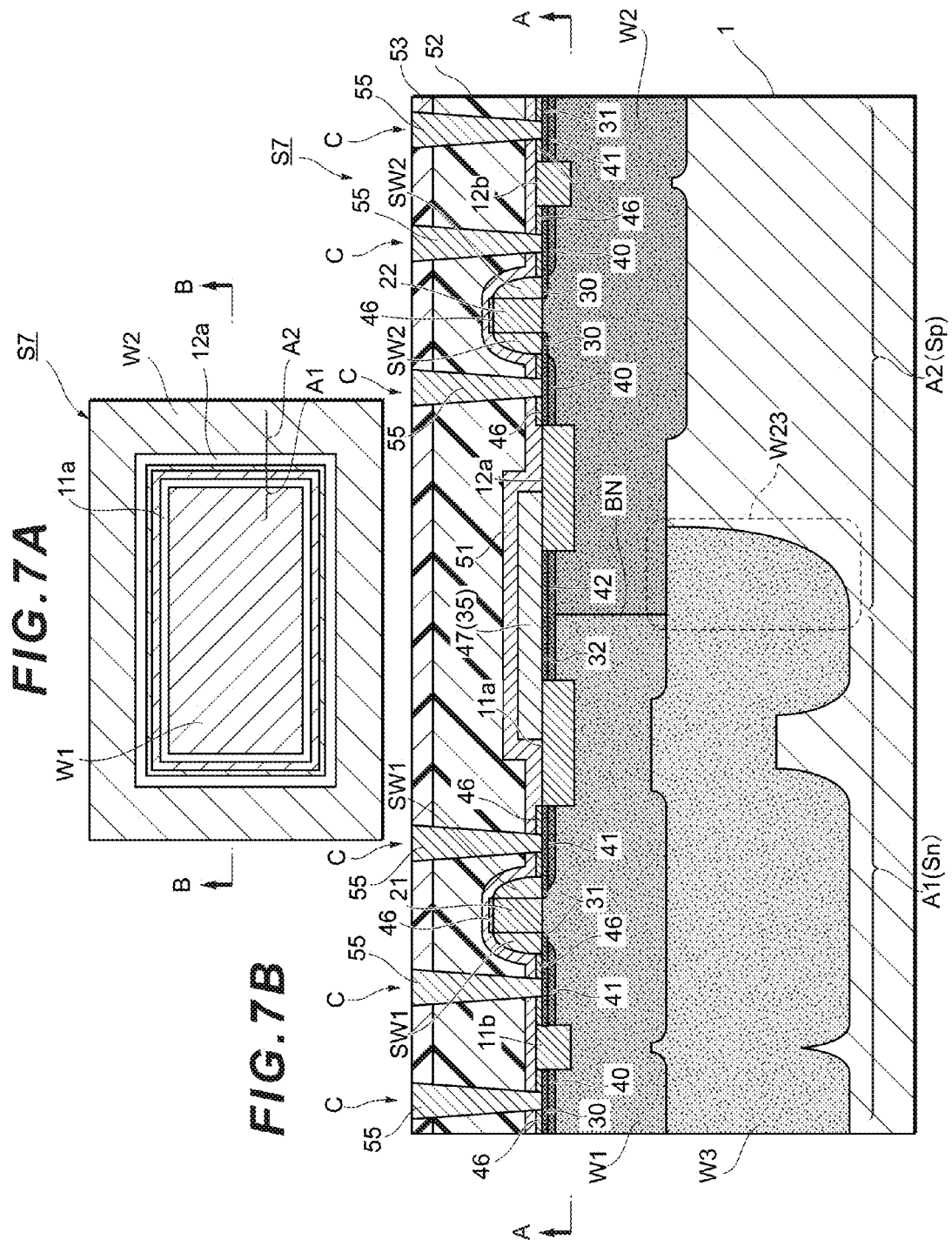
FIGS. 7A and 7B are a plan view and a cross-sectional view, respectively, schematically showing the structure of an example semiconductor device according to a seventh embodiment.
Figure 8:
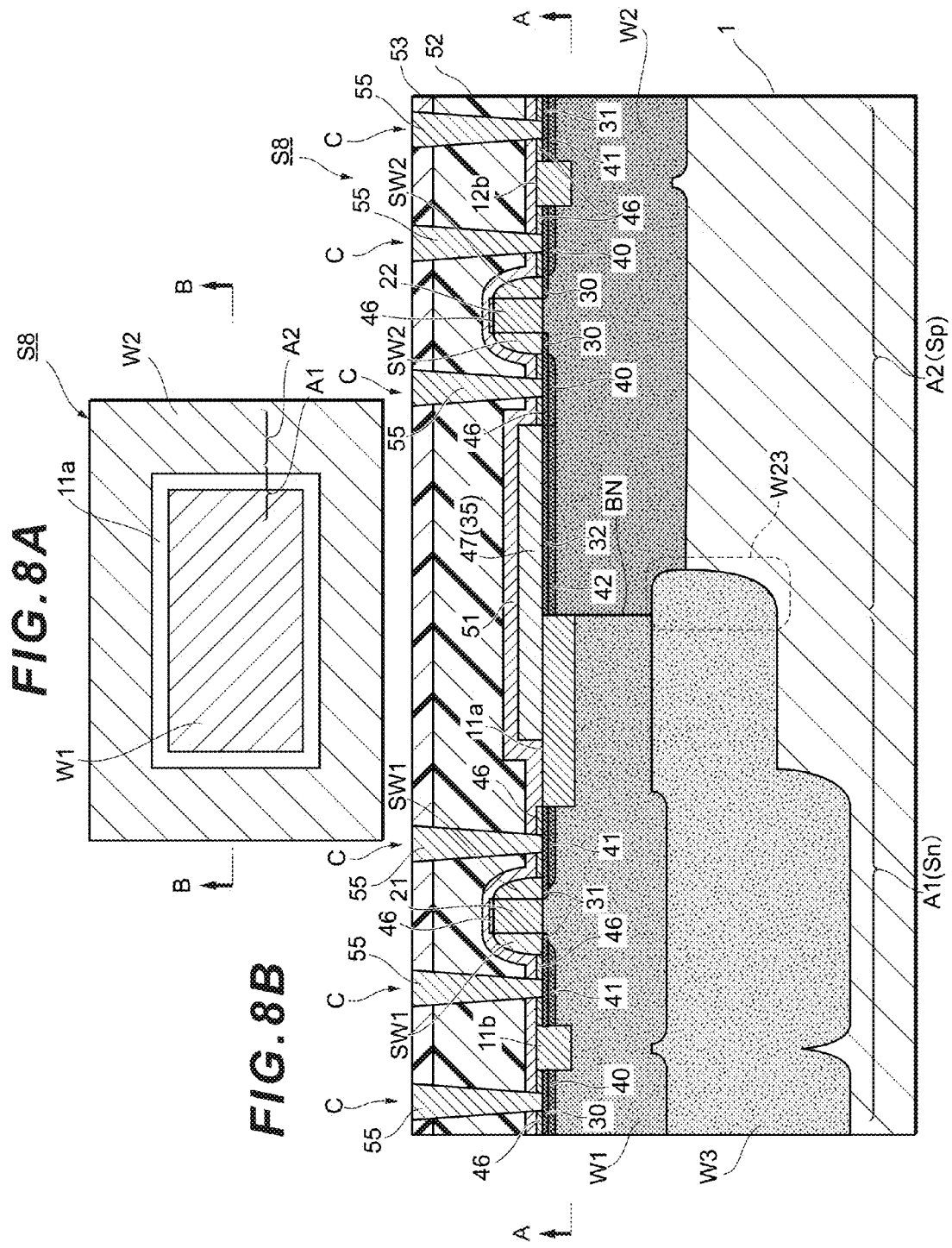
FIGS. 8A and 8B are a plan view and a cross-sectional view, respectively, schematically showing the structure of an example semiconductor device according to an eighth embodiment.
Figure 9:
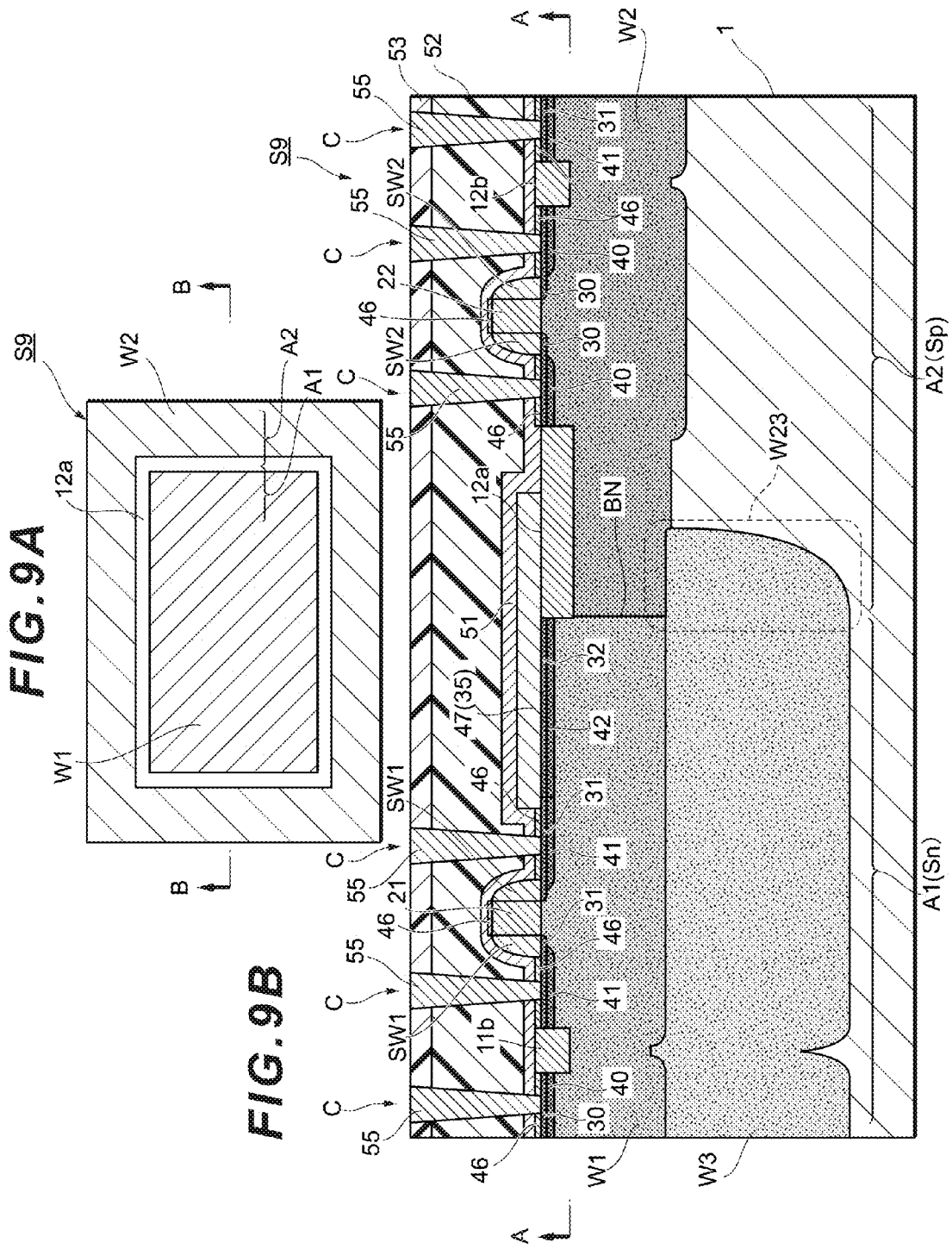
FIGS. 9A and 9B are a plan view and a cross-sectional view, respectively, schematically showing the structure of an example semiconductor device according to a ninth embodiment.
Figure 10:
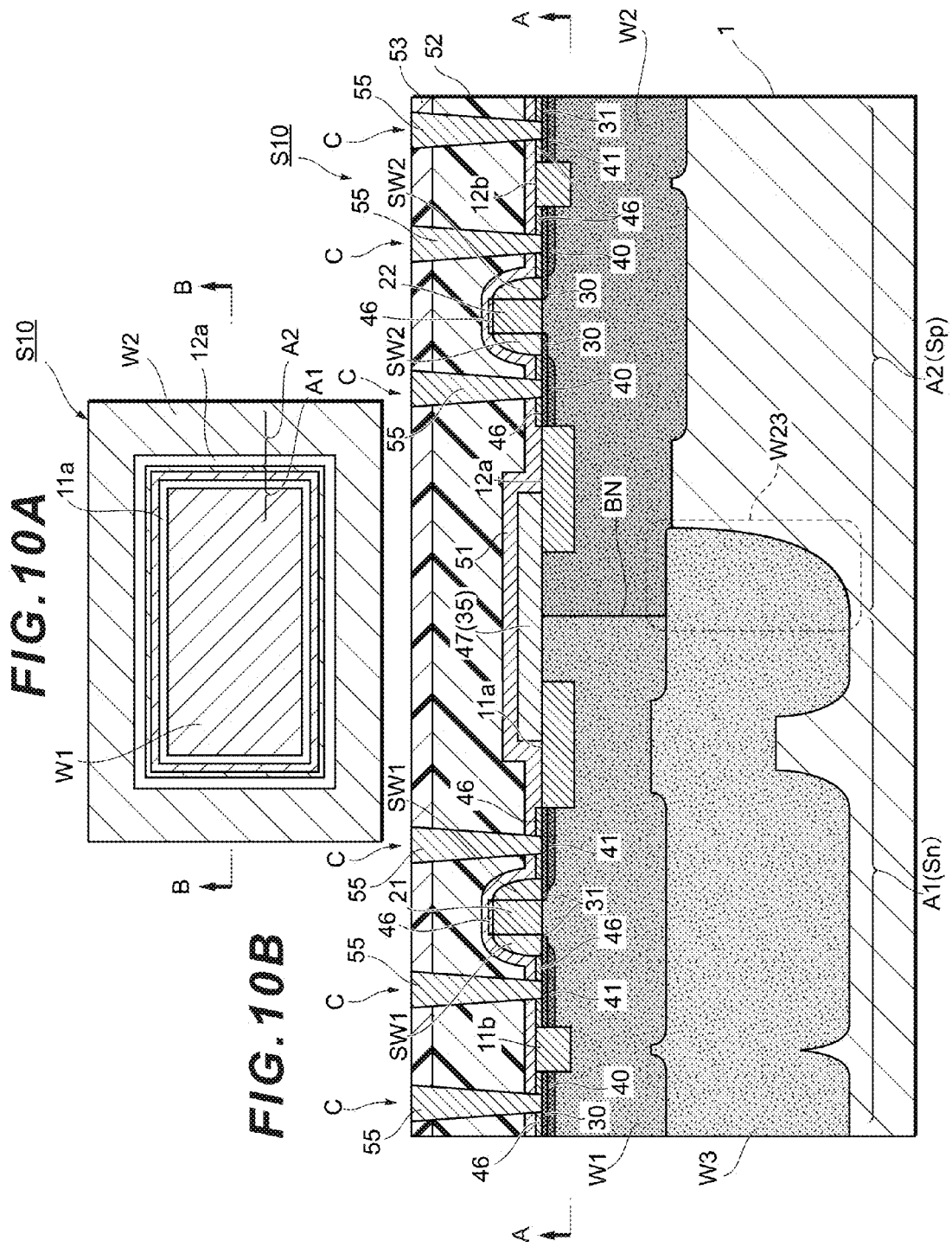
FIGS. 10A and 10B are a plan view and a cross-sectional view, respectively, schematically showing the structure of an example semiconductor device according to a tenth embodiment.
Figure 11:
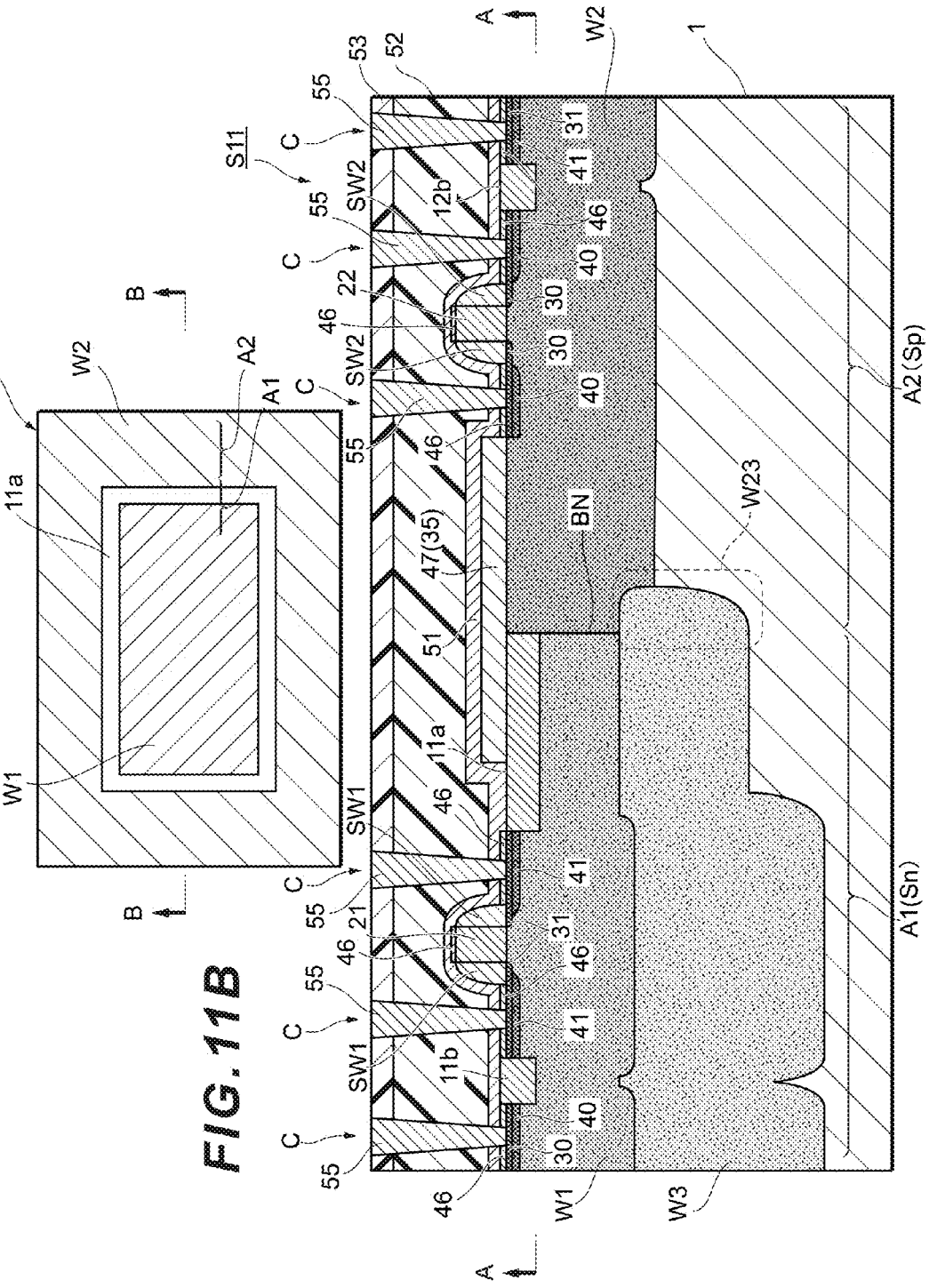
FIGS. 11A and 11B are a plan view and a cross-sectional view, respectively, schematically showing the structure of an example semiconductor device according to an eleventh embodiment.
Figure 12:
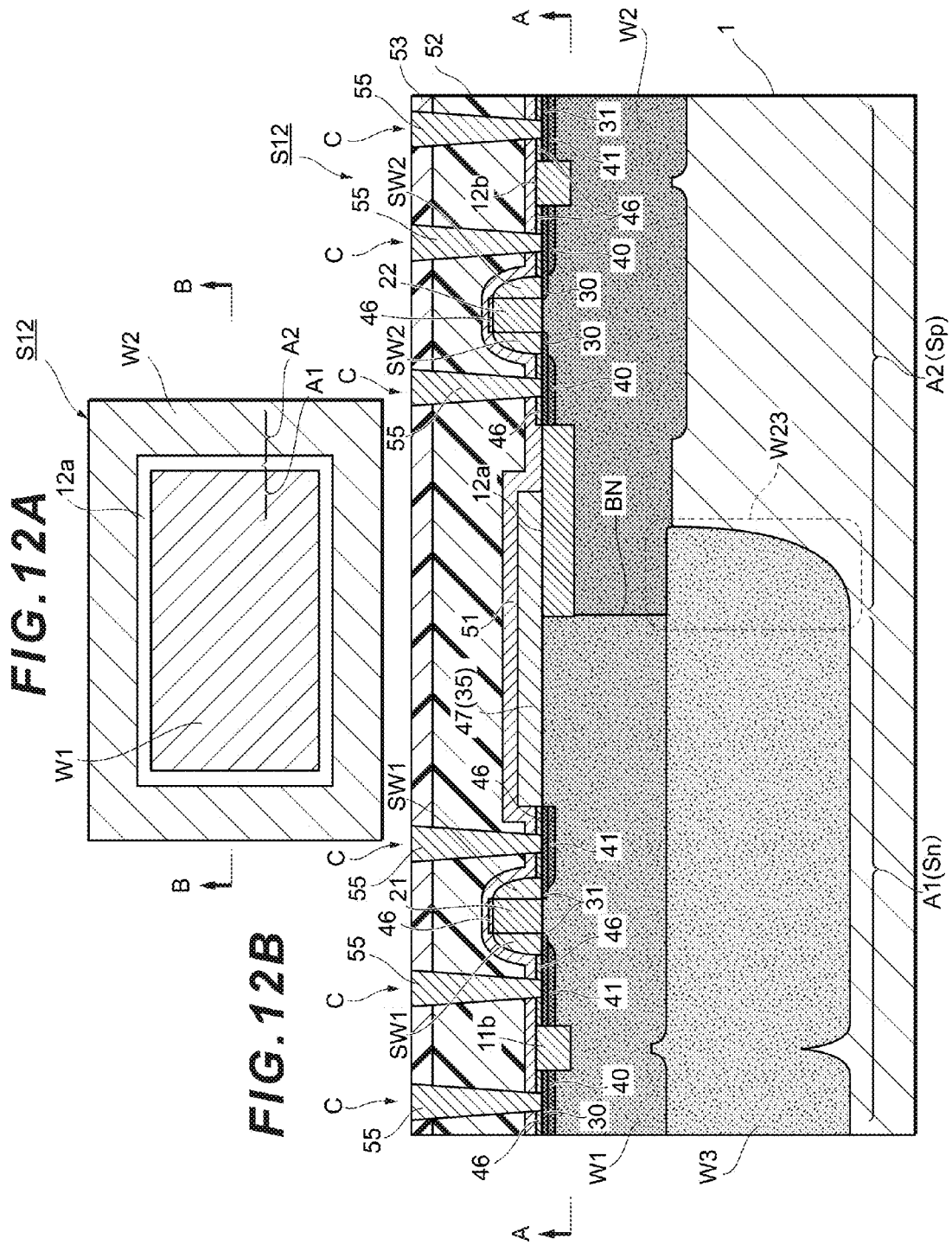
FIGS. 12A and 12B are a plan view and a cross-sectional view, respectively, schematically showing the structure of an example semiconductor device according to a twelfth embodiment.
Figure 13:
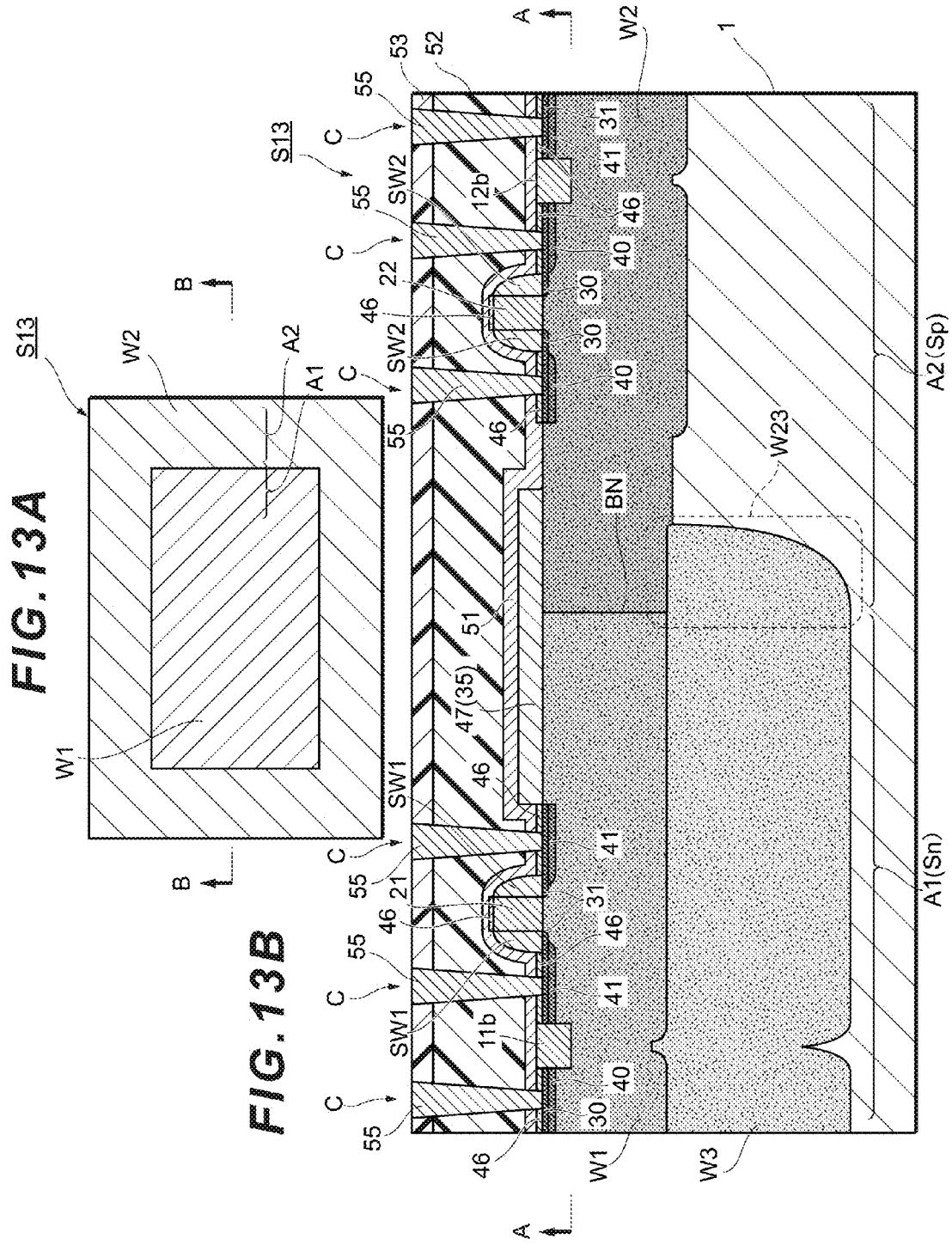
FIGS. 13A and 13B are a plan view and a cross-sectional view, respectively, schematically showing the structure of an example semiconductor device according to a thirteenth embodiment.

FIG. 1A is a cross-sectional view taken along the line A-A of FIG. 1B, and FIG. 1B illustrates a part (in the vicinity of the boundary between an N-type transistor formation area and a P-type transistor formation area) of the cross section taken along the line B-B in FIG. 1A. The same relationship between the drawings "A" and "B" also applies to FIGS. 2A and 2B through 13A and 13B, respectively.

In FIGS. 1A and 1B, the semiconductor device S1 includes an N-type transistor Sn (first transistor) and a P-type transistor Sp (second transistor) formed in a P-type silicon substrate 1. These N-type transistor Sn and P-type transistor Sp are isolated by an element isolation structure that is formed by an element isolation technique (such as STI), for example, and these transistors make up a complementary-type transistor. This complementary-type transistor has a triple-well structure such that a P well W1 (first well) is formed at an N-type transistor formation area A1, an N well W2 (second well) is formed at a P-type transistor formation area A2 and a major part of an N well W3 is formed under the P well W1. A part of the N well W3 is formed so as to protrude toward the N well W2 from the region of the P well W1 in the plan view of the silicon substrate 1 (the part surrounded with a broken-line frame W23 in FIG. 1B), and the N well W2 and the N well W3 are electrically connected at that part.

Such an element isolation structure includes element isolation films 11a, 11b (at least 11a corresponds to a first element isolation film) that are provided at the region of the P well W1 of the N-type transistor formation area A1 and element isolation films 12a, 12b (at least 12a corresponds to a second element isolation film) that are provided at the region of the N well W2 of the P-type transistor formation area A2. Then any of the element isolation films 11a, 11b and the element isolation films 12a, 12b is formed so as to have a portion that does not extend over the boundary (line) BN between the P well W1 and the N well W2.

That is, any of the element isolation films 11a, 11b, 12a, and 12b in the semiconductor device S1 formed has a portion that does not cover up the boundary BN between the P well W1 and the N well W2. In other words, the semiconductor device S1 includes a portion at the boundary BN between the P well W1 and the N well W2 where any of the element isolation films 11a, 11b, 12a and 12b is not formed.

The following describes a specific structure of the thus configured semiconductor device S1 and an exemplary manufacturing process thereof in details.

Figure 14:
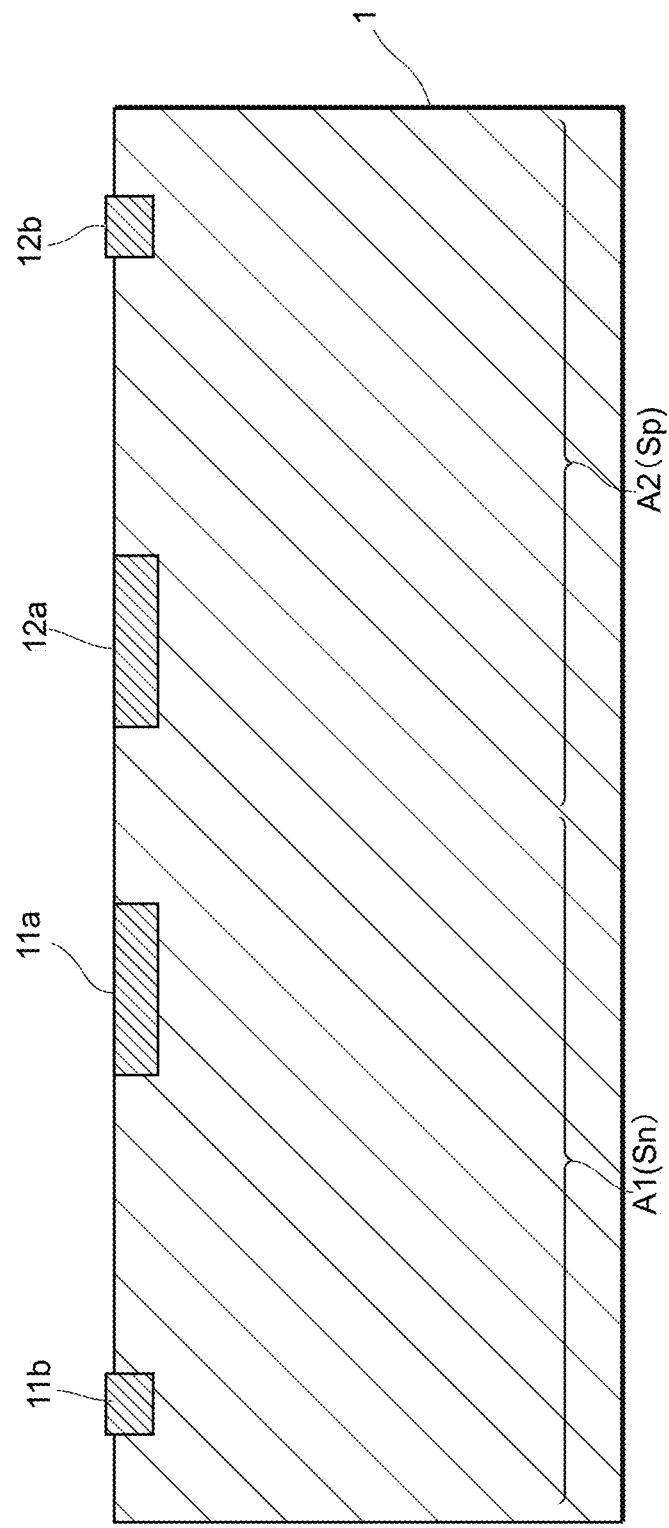
FIGS. 14 to 26 illustrate an example process flow (cross-sectional view corresponding to FIG. 1B) to show the manufacturing state of an example semiconductor device according to the first embodiment.

In FIG. 14, a P-type silicon substrate 1 is first prepared, and element isolation is performed by an element isolation technique (e.g., STI). Element isolation films 11a, 11b formed in the N-type transistor formation area A1 and element isolation films 12a, 12b formed in the P-type transistor formation area A2 as STI may have a thickness of about 350 nm, for example.

Figure 15:
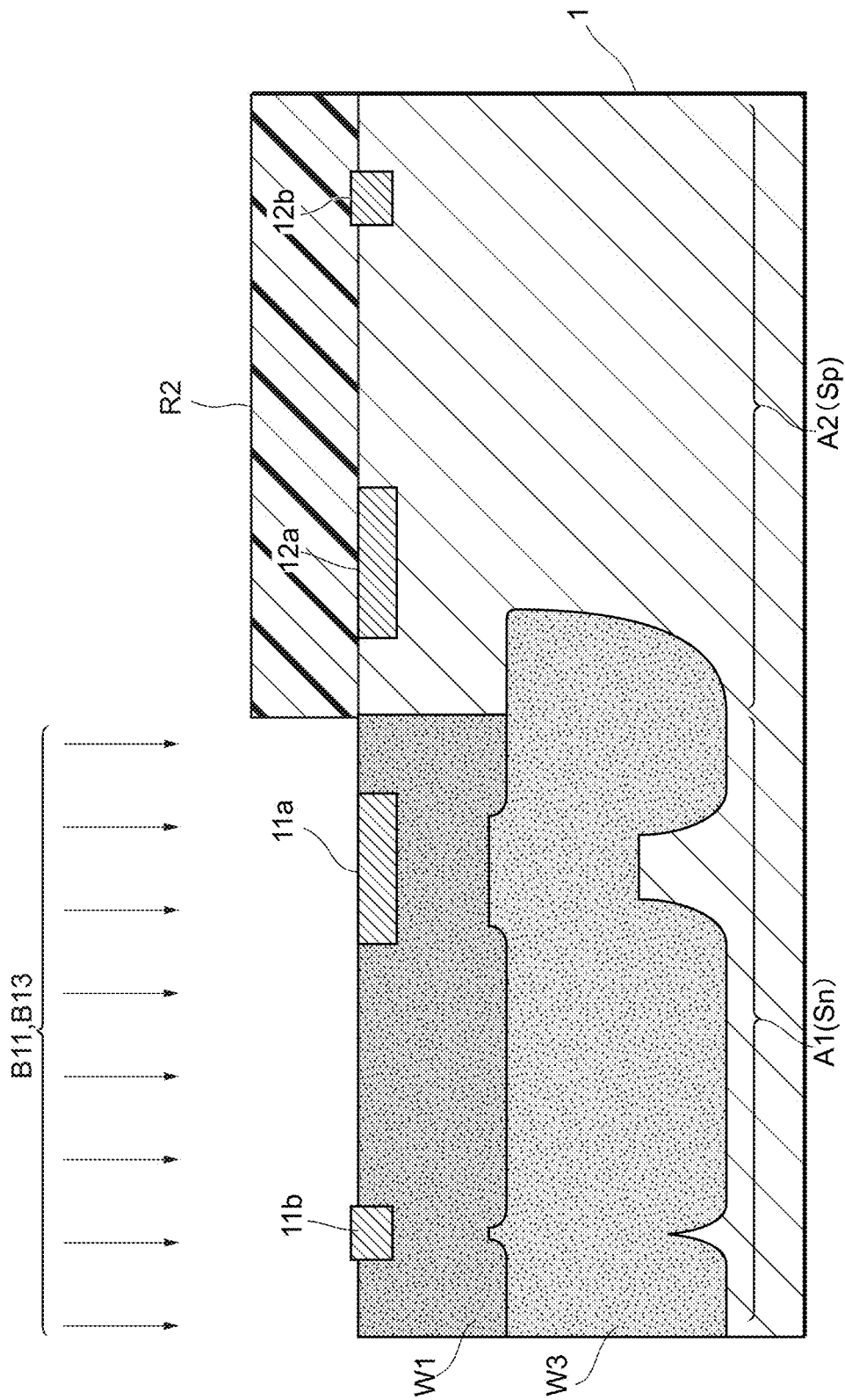

In FIG. 15, the P-type transistor formation area A2 of the silicon substrate 1 is next covered with a resist mask R2 (second mask) of an appropriate thickness, and then a P well W1 (shallow P well) is formed by ion-implantation (ion beam B11, e.g., boron, 420 keV, $1.0 \times 10^{13}$ cm$^{-2}$) at the N-type transistor formation area A1. Subsequently, a P well W3 (deep P well) is formed using the same resist mask R2 by ion-implantation (ion beam B13; e.g., phosphorus, 2 MeV, $2.0 \times 10^{13}$ cm$^{-2}$) at the N-type transistor formation area A1 through the P well W1. At this time, ions implanted to the N-type transistor formation area A1 through the P well W1 tend to diffuse not only in the depth direction (vertical direction) but also toward the P-type transistor formation area A2. This tendency forms a part surrounded with the broken-line frame W23 in FIG. 1B as a part of the N well W3.

Figure 16:
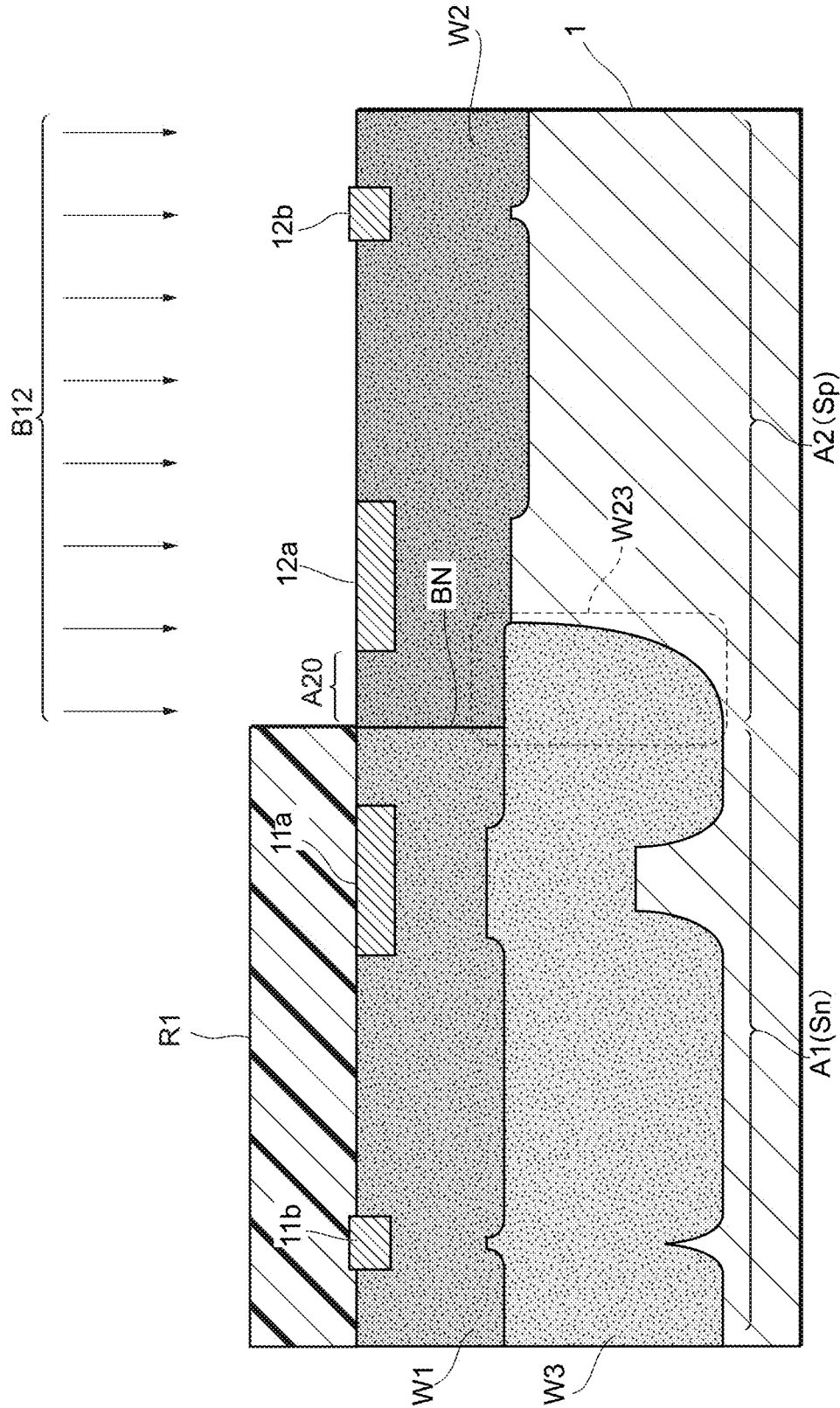

In FIG. 16, the resist mask R2 is next removed, and the N-type transistor formation area A1 is covered with a resist mask R1 (first mask) of an appropriate thickness. Then an N well W2 (shallow N well) is formed by ion-implantation (ion beam B12, e.g., phosphorus, 600 keV, $4.2 \times 10^{12}$ cm$^{-2}$) at the P-type transistor formation area A2. This can electrically connect the N well W3 and the N well W2, while isolating the P well W1 and the P-type silicon substrate 1.

Ion implantation using the resist masks R1 and R2 yields the structure of the element isolation films 11a, 11b, 12a and 12b that are disposed away from the boundary BN between the P well W1 (first well) and the N well W2 (second well). In this way, the structure is formed so that any of the element isolation films 11a, 11b, 12a and 12b has a portion that does not extend over (i.e., does not cover up) the boundary BN between the P well W1 and the N well W2.

Figure 17:
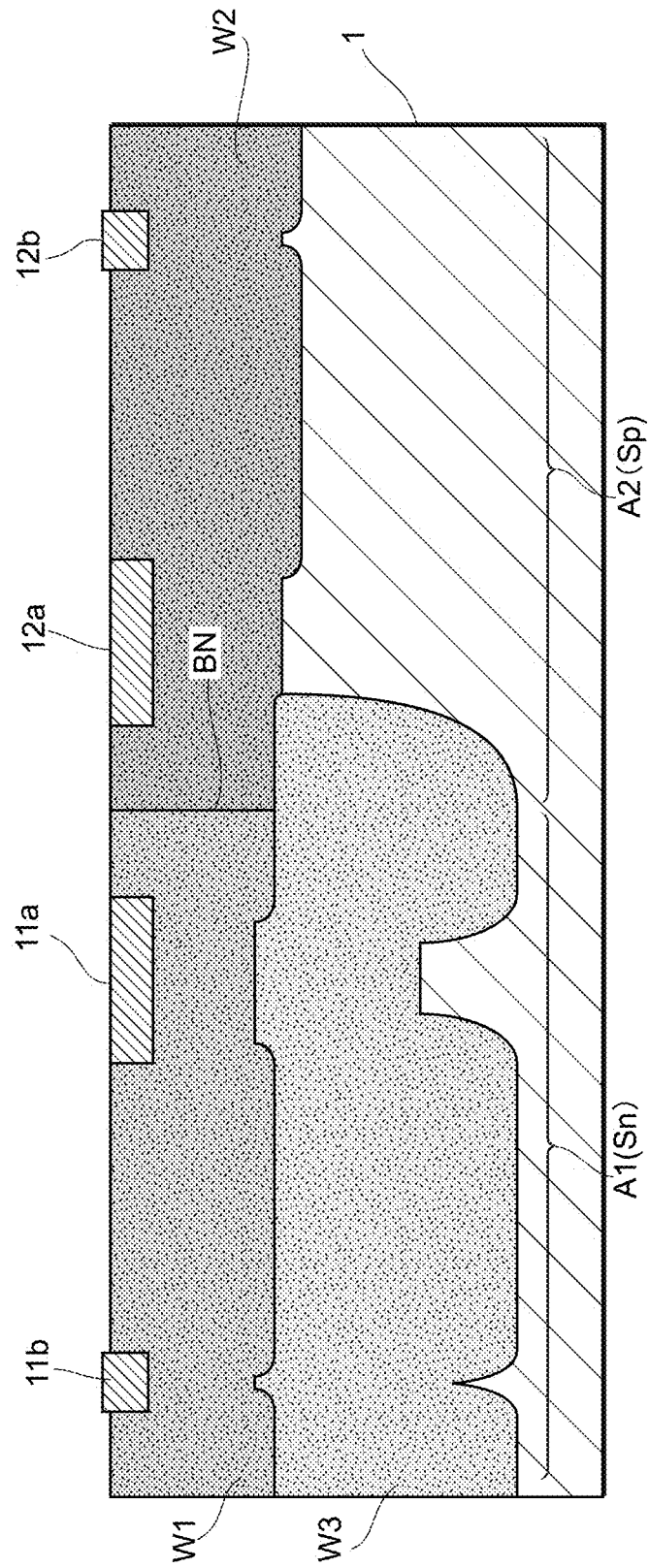

In FIG. 17, after the structure is formed, the resist mask R1 is removed, and the wells are annealed (e.g., at 1,000° C. in nitrogen (N$_2$) for 20 seconds).

Figure 18:
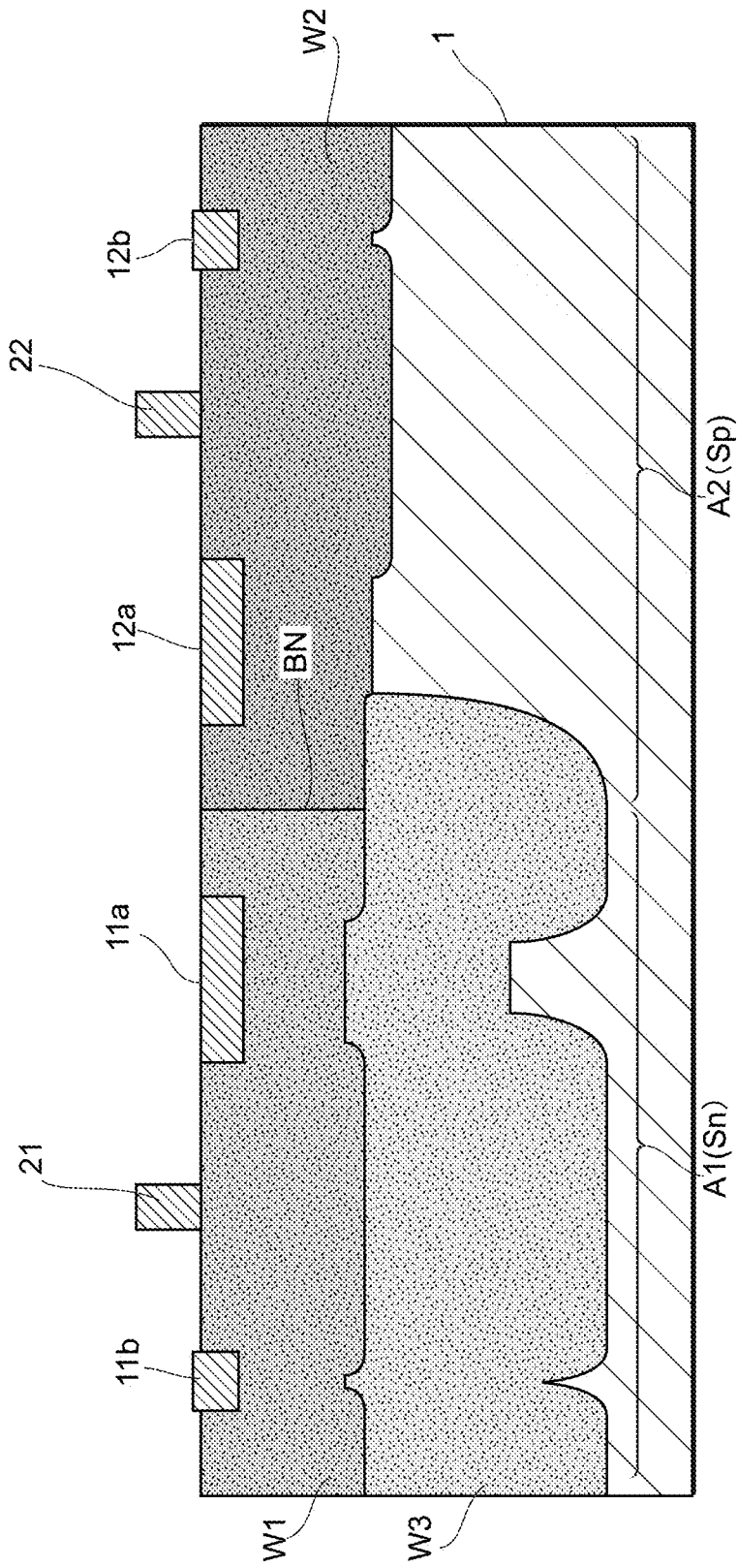

In FIG. 18, a gate oxide film (e.g., thermally-oxide film) and a polysilicon film (e.g., thickness of about 180 nm) are then successively formed on the silicon substrate 1, and then a gate electrode 21 of the N-type transistor and a gate electrode 22 of the P-type transistor are formed by patterning.

Figure 19:
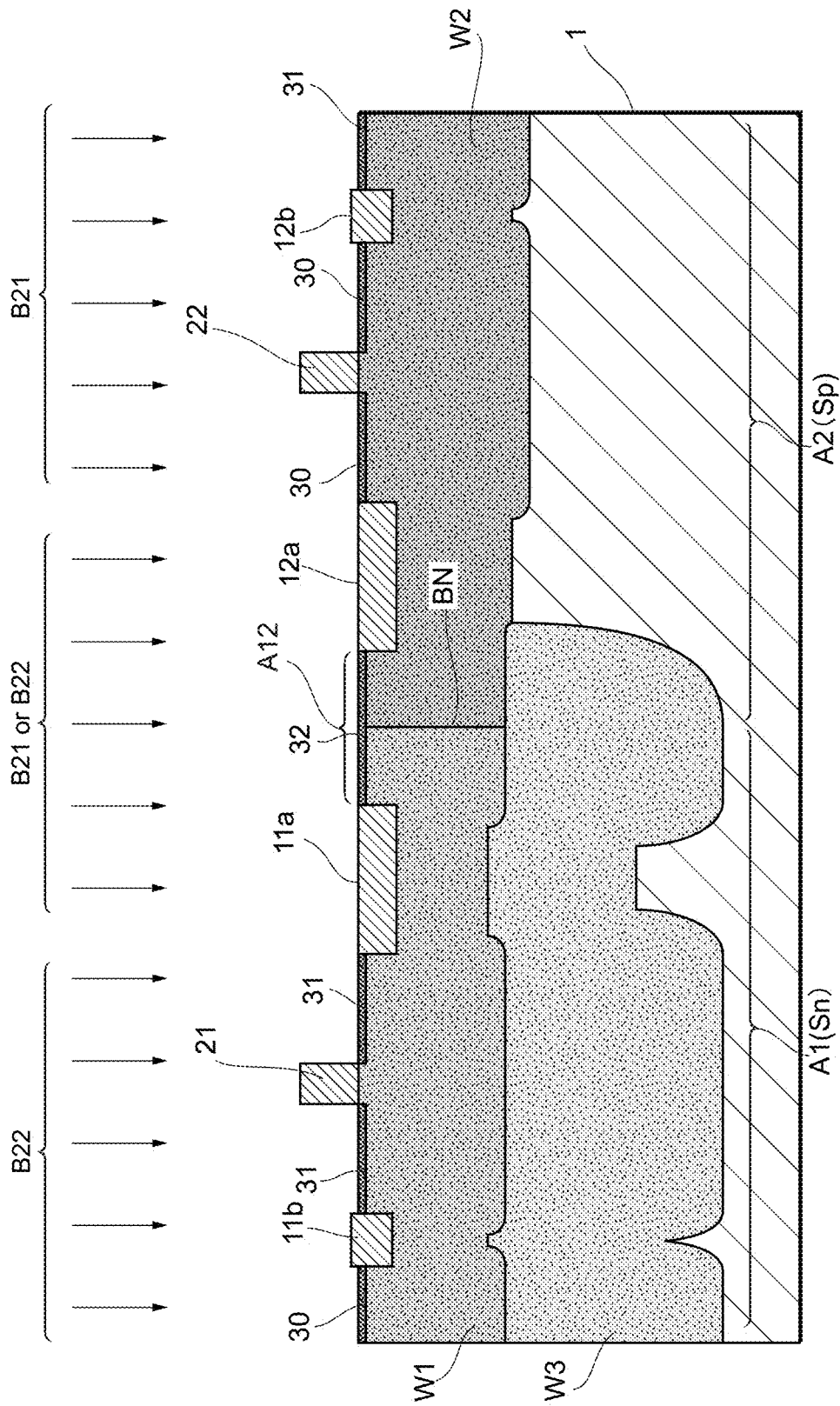

In FIG. 19, ion implantation to form a P-type LDD (Lightly Doped Drain) region 30 (PLDD) at the P well W1 and an N-type LDD region 31 (NLDD) at the N well W2 is then performed alternately while covering a non-implantation region with resist selectively. For instance, the P-type LDD region 30 can be formed by using an ion beam B21 of boron fluoride (BF$_2$) of 80 keV, 4.5×10$^{13}$ cm$^{-2}$. At this time, a non-implantation region of the ion beam B21 is covered with resist. The N-type LDD region 31 can be formed by using an ion beam B22 of phosphorus of 35 keV, 4.0×10$^{13}$ cm$^{-2}$. At this time, a non-implantation region of the ion beam B22 is covered with resist. Then, ion implantation is performed to form a LDD region 32 at a boundary region A12 also between the N-type transistor formation area A1 and the P-type transistor formation area A2. The LDD structure at this part may be PLDD or NLDD. That is, the LDD region 32 may be formed by using any one of the ion beams B21 and B22 as stated above. At this time, a non-implantation region of the ion beam B21 or the ion beam B22 is covered with resist.

Figure 20:
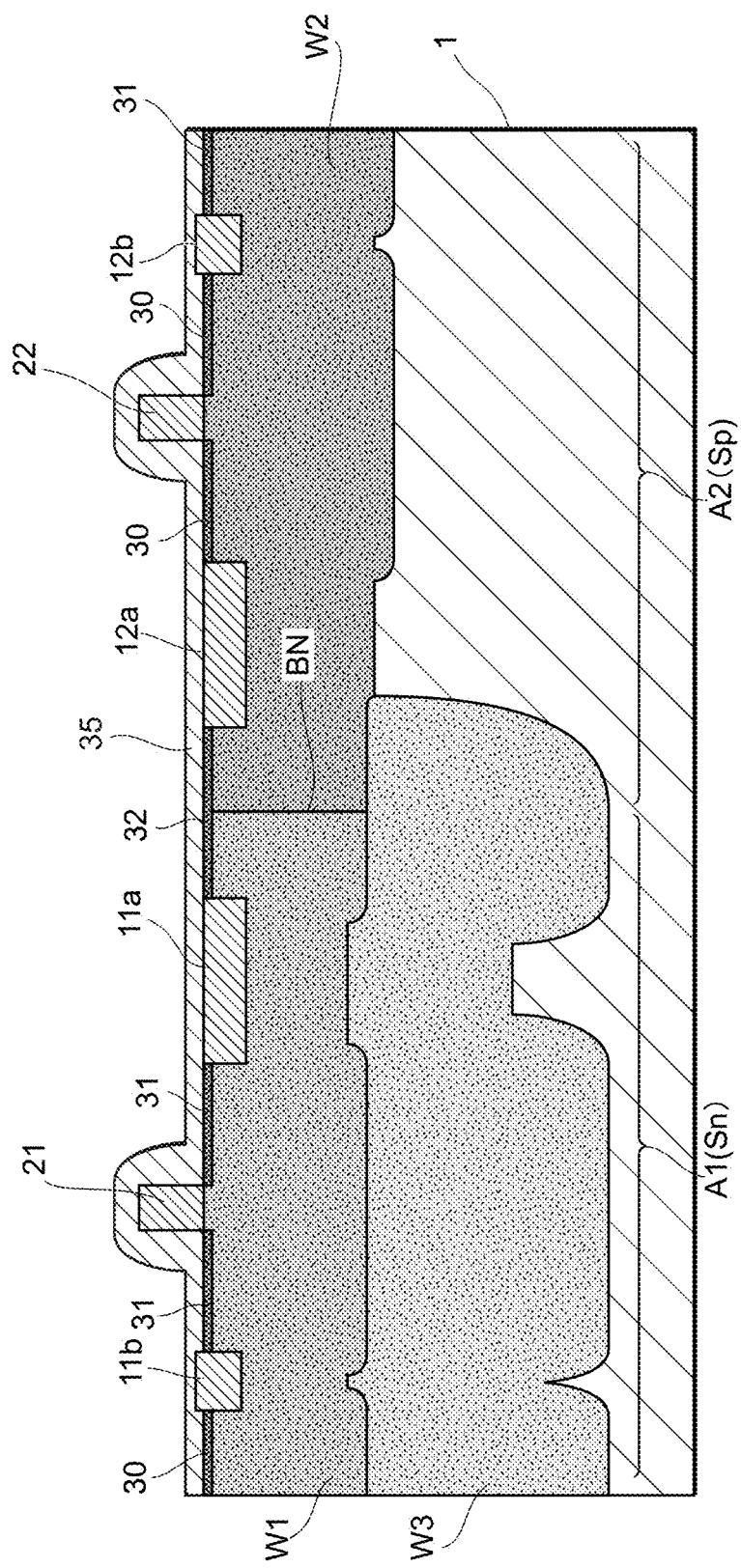

In FIG. 20, a sidewall insulating film 35 (e.g., SiN film or SiO$_2$ film of about 100 nm in thickness) is next formed on the silicon substrate 1, which is to form sidewalls of the gate electrodes 21 and 22.

Figure 21:
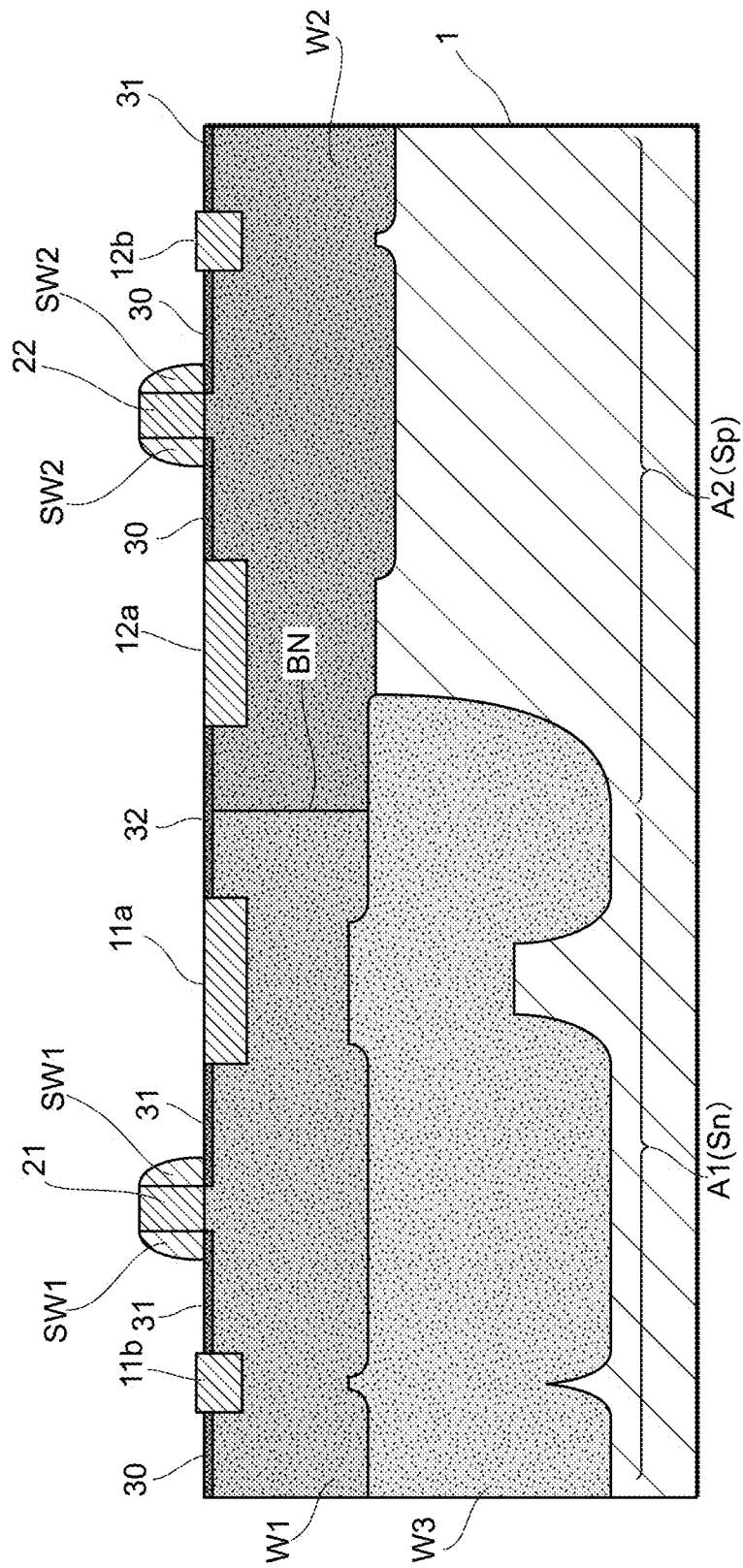

In FIG. 21, the sidewall insulating film 35 is then etched back to form sidewalls SW1 and SW2 of the gate electrodes 21 and 22.

Figure 22:
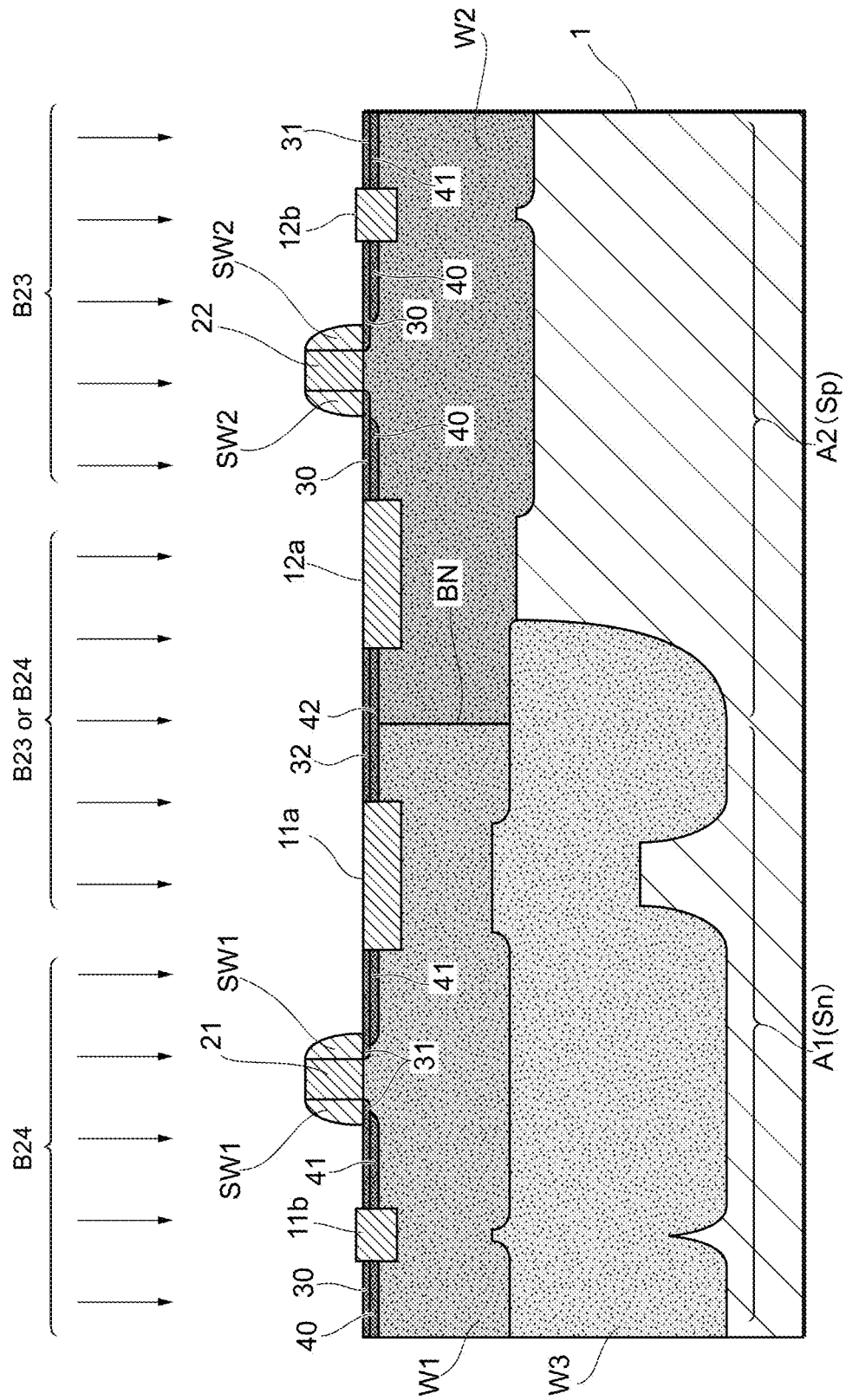

In FIG. 22, ion implantation to the LDD regions 30, 31 and 32 is next performed alternately while covering a non-implantation region with resist selectively. After that, activation-annealing is performed to form step doping (SD) regions 40, 41 and 42. For instance, the P-type SD region 40 can be formed based on the P-type LDD region 30 by using an ion beam B23 of boron of 5 keV, 2.0×10$^{15}$ cm$^{-2}$. At this time, a non-implantation region of the ion beam B23 is covered with resist. The N-type SD region 41 can be formed based on the N-type LDD region 31 by using an ion beam B24 of phosphorus of 15 keV, 2.0×10$^{15}$ cm$^{-2}$. At this time, a non-implantation region of the ion beam B24 is covered with resist. The SD region 42 can be formed based on the LDD region 32 similarly by using any one of the ion beams B23 and B24 as stated above, for example. At this time, a non-implantation region of the ion beam B23 or the ion beam B24 is covered with resist. The activation-annealing is performed at 1,000° C. in nitrogen (N$_2$) for 20 seconds, for example.

Figure 23:
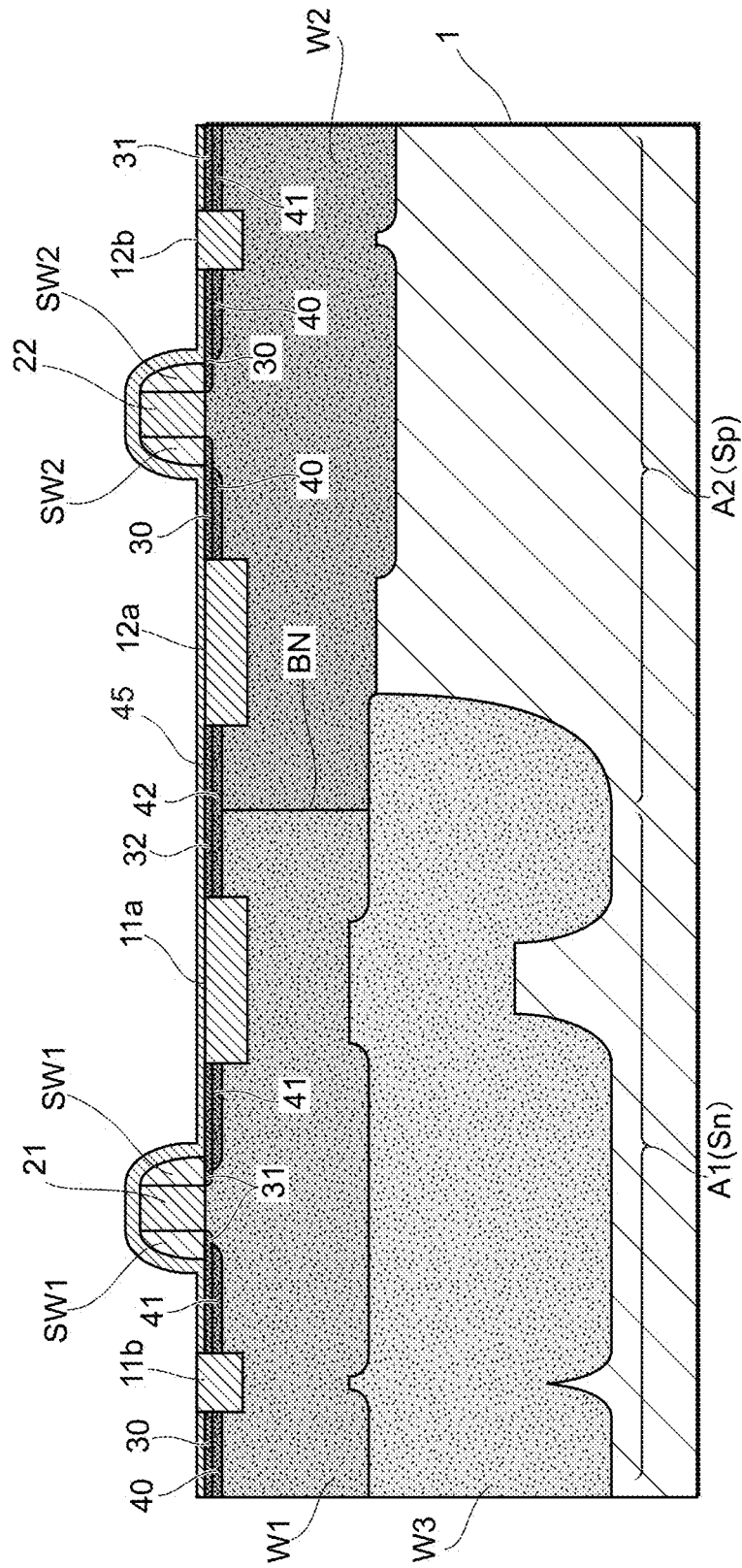

In FIG. 23, a metal film 45 (e.g., Co film of about 6 nm and TiN film of about 30 nm) to form metal silicide for low resistance is then formed on the silicon substrate 1 of FIG. 22.

Figure 24:
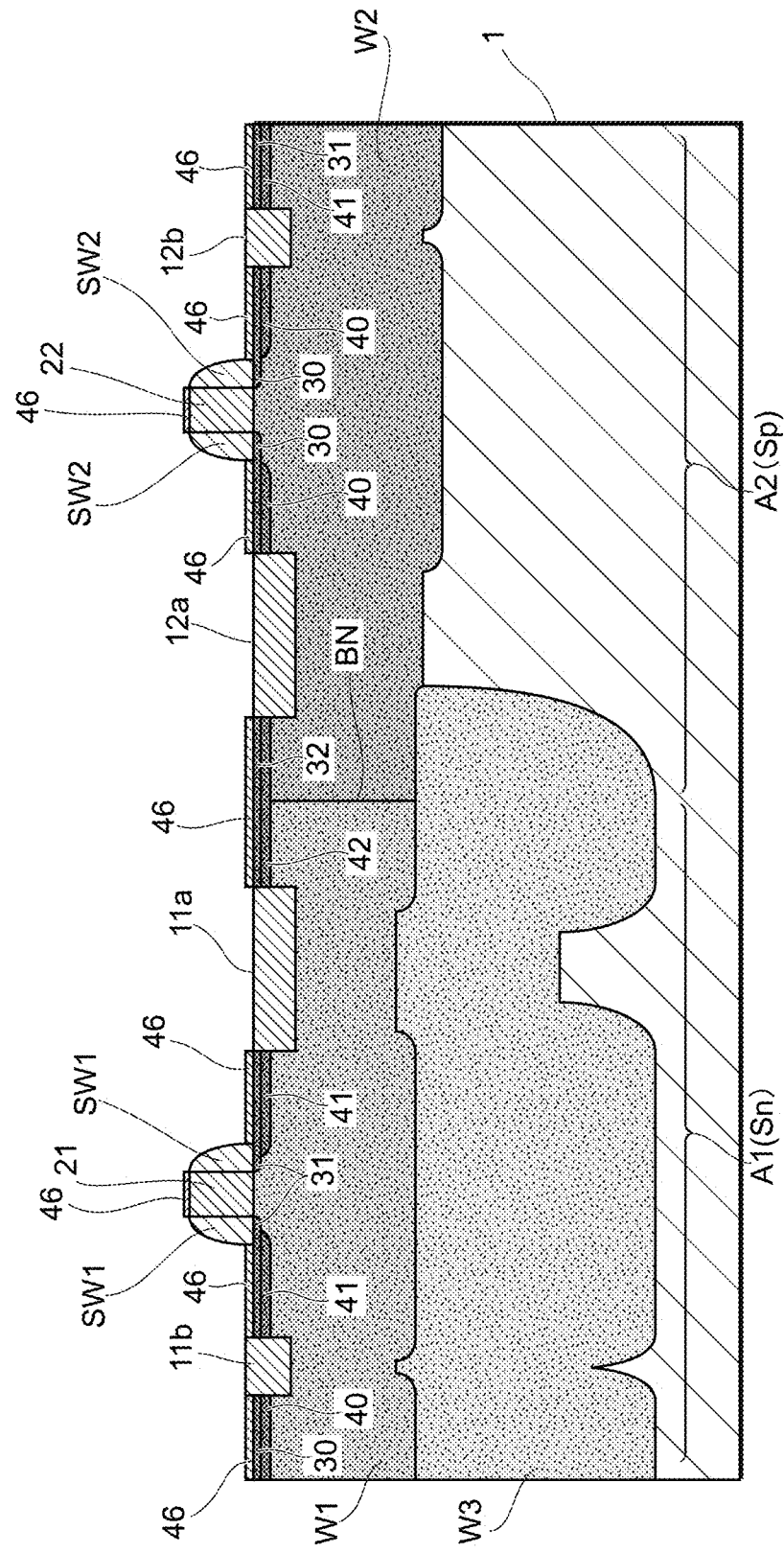

In FIG. 24, RTA (Rapid Thermal Anneal) at 540° C. under a nitrogen (N$_2$) atmosphere for 30 seconds, for example, wash-out using appropriate chemicals, and RTA at 750° C. under a nitrogen (N$_2$) atmosphere for 30 seconds, for example, are thereafter performed thereto to salicidize parts on top of the SD regions 40, 41 and 42 and the gate electrodes 21 and 22, thus forming metal silicide 46 (CoSi$_2$ film). Ni or Ti may be used as the silicide material depending on desired resistance and temperature characteristics, and in that case, the RTA is performed in a condition suitable for the formation of such metal silicide.

Figure 25:
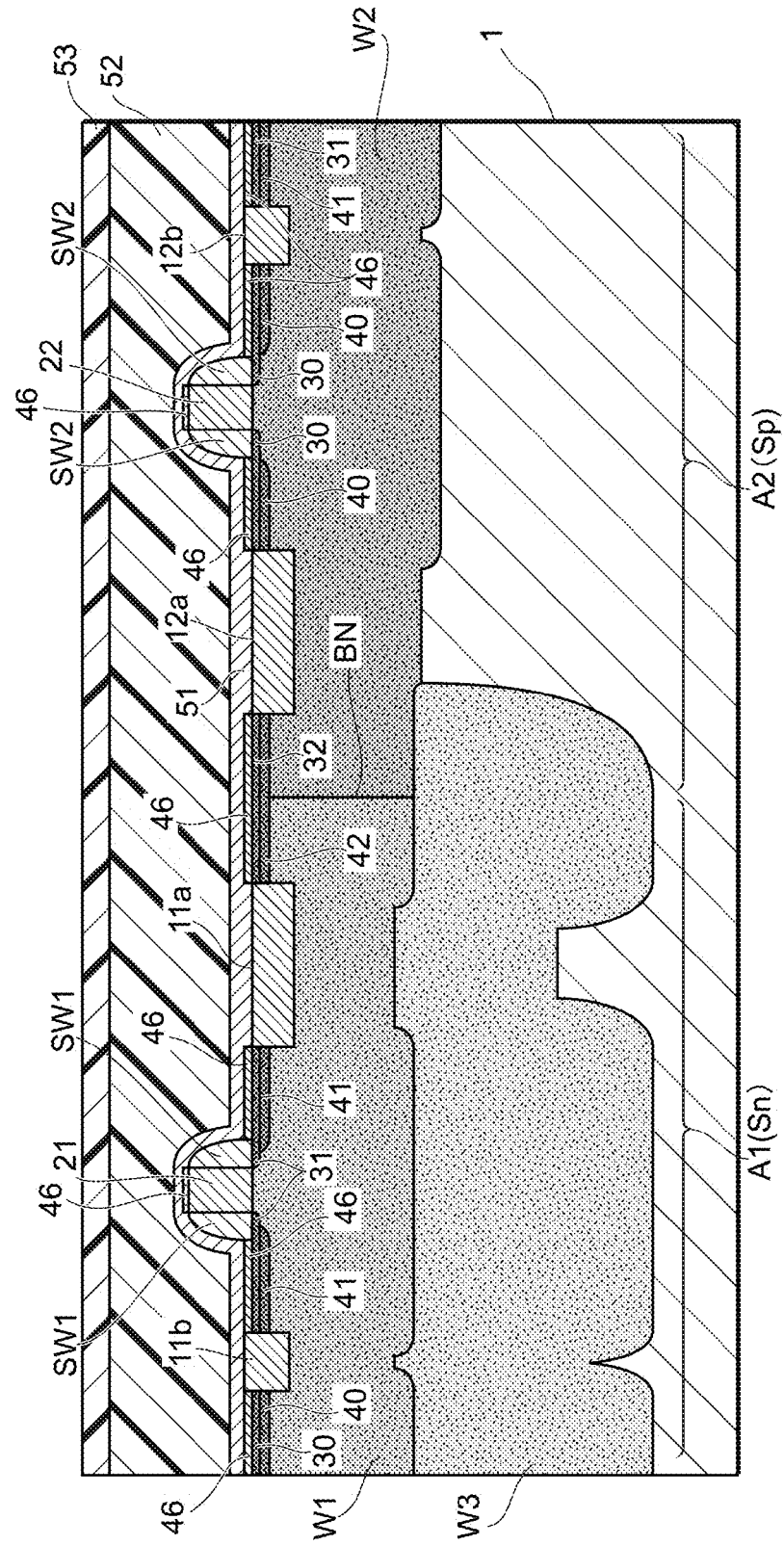

In FIG. 25, an inter-bulk layer dielectric film (e.g., SiO$_2$ film of about 20 nm in thickness) and a SiN film 51 (e.g., about 80 nm) are then formed along a side face and a top face of the gate electrodes 21 and 22 of FIG. 24 (i.e., so as to cover the gate electrodes along the gate-length direction) and so as to cover the surface of the silicon substrate 1 on which the metal silicide 46 is formed. Then, an inter-bulk layer tetraethyl orthosilicate, borophosphosilicate glass (TEOS-BPSG) film (e.g., about 1,300 nm in thickness) is formed on the SiN film 51, which is flattened by chemical mechanical polishing (CMP), for example, thus forming an ILD 52 (interlayer dielectric film; e.g., having a thickness of 750 nm as the thickness of the BPSG film on the SiN film 51). An inter-bulk layer dielectric film 53 (e.g., SiO$_2$ film of about 100 nm in thickness) is further formed on the ILD 52.

Figure 26:
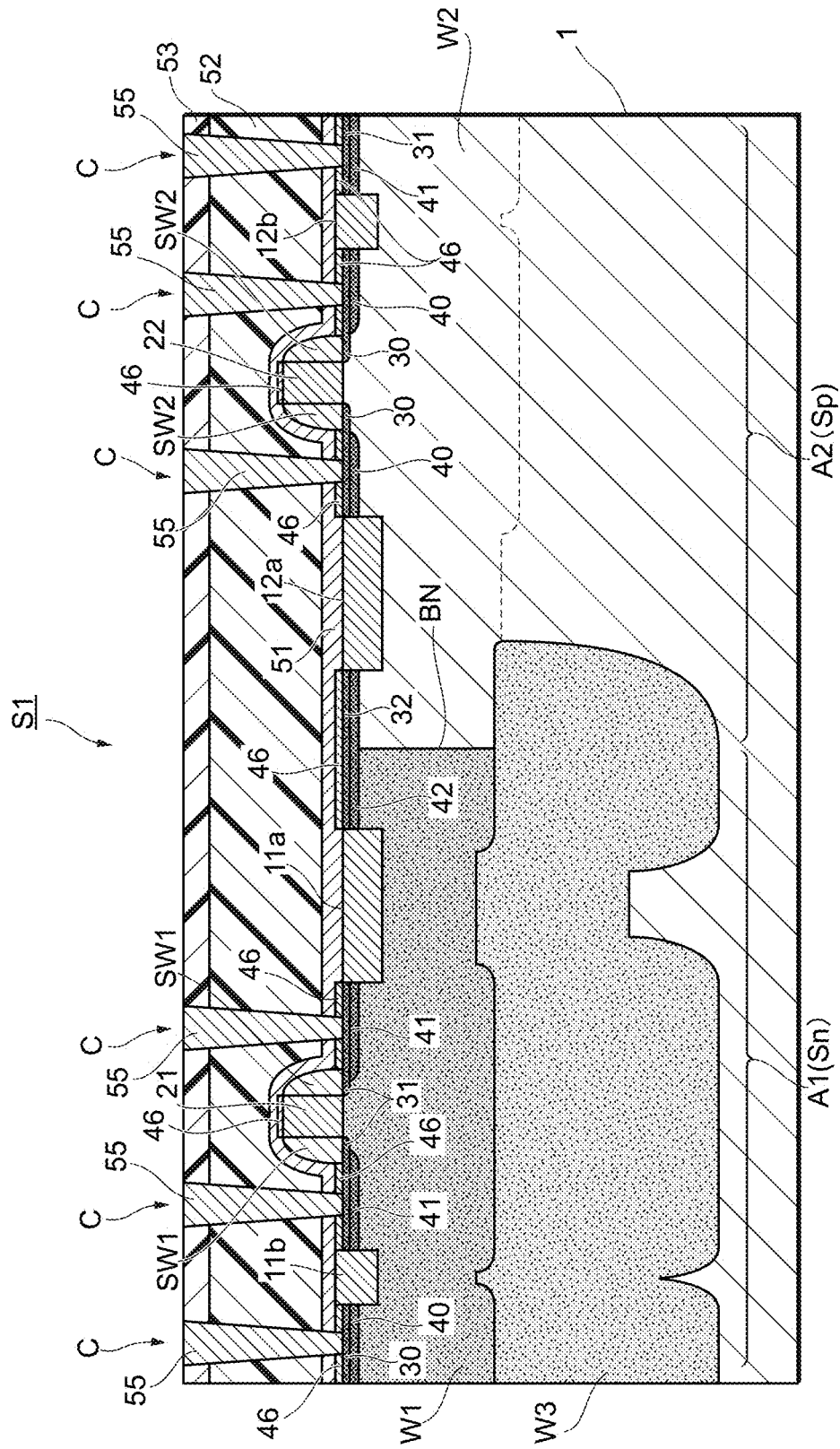

In FIG. 26, photolithography and etching are next performed thereto, thus forming contact holes C on the metal silicide 46 formed at the SD regions 40, 41 and 42. Then a barrier metal film (Ti/TiN, Ta or the like) and a metal film (e.g., a film made of W, Al, Cu or the like) are formed on the silicon substrate 1 including the inner wall (sidewall and bottom wall) of these contact holes C, thus filling the contact holes C with the metal. Then, CMP is performed to the silicon substrate 1 to flatten the surface of the substrate, thus forming a basic structure of the semiconductor device S1 including metal contacts 55 formed therein.

According to the thus configured semiconductor device S1 and its manufacturing method, ion implantation is performed to form the P well W1 and the N well W3 as well as the N well W2 so that any of the element isolation films 11a, 11b, 12a and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 1B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Second Embodiment

Referring next to FIGS. 2A and 2B, the following describes the structure of an example semiconductor device S2 according to a second embodiment and the procedure in the manufacturing method therefor. The semiconductor device S2 has the same structure as that of the semiconductor device S1 illustrated in FIGS. 1A and 1B except that it includes an element isolation film 11a disposed at a P well W1 that extends close to the boundary BN between the P well W1 and an N well W2 and that it does not have the element isolation film 12a of the N well W2, meaning that a SD region 42 is formed on the N well W2 side only.

The thus configured semiconductor device S2 can be manufactured by the same procedure in the manufacturing process of the semiconductor device 51 illustrated in FIGS. 14 to 26, except that element isolation films 11a, 11b and 12b illustrated in FIG. 2B are formed in the silicon substrate 1 at the above step discussed in the context of FIG. 14 (i.e., the element isolation film 12a is not formed), and so the duplicated descriptions are omitted.

According to the thus configured semiconductor device S2 and its manufacturing method as well, ion implantation is performed to form the P well W1 and the N well W3 as well as the N well W2 so that any of the element isolation films 11a, 11b, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 2B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Third Embodiment

Referring next to FIGS. 3A and 3B, the following describes the structure of an example semiconductor device S3 according to a third embodiment and the procedure in the manufacturing method therefor. The semiconductor device S3 has the same structure as that of the semiconductor device S1 illustrated in FIGS. 1A and 1B, except that it includes an element isolation film 12a disposed at an N well W2 that extends close to the boundary BN between a P well W1 and the N well W2 and that it does not have the element isolation film 11a of the P well W1, meaning that a SD region 42 is formed on the P well W1 side only.

The thus configured semiconductor device S3 can be manufactured by the same procedure in the manufacturing process of the semiconductor device 51 illustrated in FIGS. 14 to 26 except that element isolation films 11b, 12a and 12b illustrated in FIG. 3B are formed in the silicon substrate 1 at the above step discussed in the context of FIG. 14 (i.e., the element isolation film 11a is not formed), and so the duplicated descriptions are omitted.

According to the thus configured semiconductor device S3 and its manufacturing method as well, ion implantation is performed to form the P well W1 and the N well W3 as well as the N well W2 so that any of the element isolation films 11b, 12a, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 3B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Fourth Embodiment

Referring next to FIGS. 4A and 4B as well as to FIGS. 14-22 and 27-32, the following describes the structure of an example semiconductor device S4 according to a fourth embodiment and the procedure in the manufacturing method therefor. The semiconductor device S4 has the same structure as that of the semiconductor device S1 illustrated in FIGS. 1A and 1B, except that it does not include metal silicide 46 on a SD region 42 located between element isolation films 11a and 12a, and it has a silicide block insulating film 47 between the SD region 42 and a SiN film 51.

The following describes a specific structure of the thus configured semiconductor device S4 and an exemplary manufacturing process thereof in details. Herein, the procedure illustrated in FIGS. 14 to 22 in the manufacturing process of the semiconductor device S1 of the first embodiment is first performed (until the formation of the SD regions 40, 41 and 42).

Figure 27:
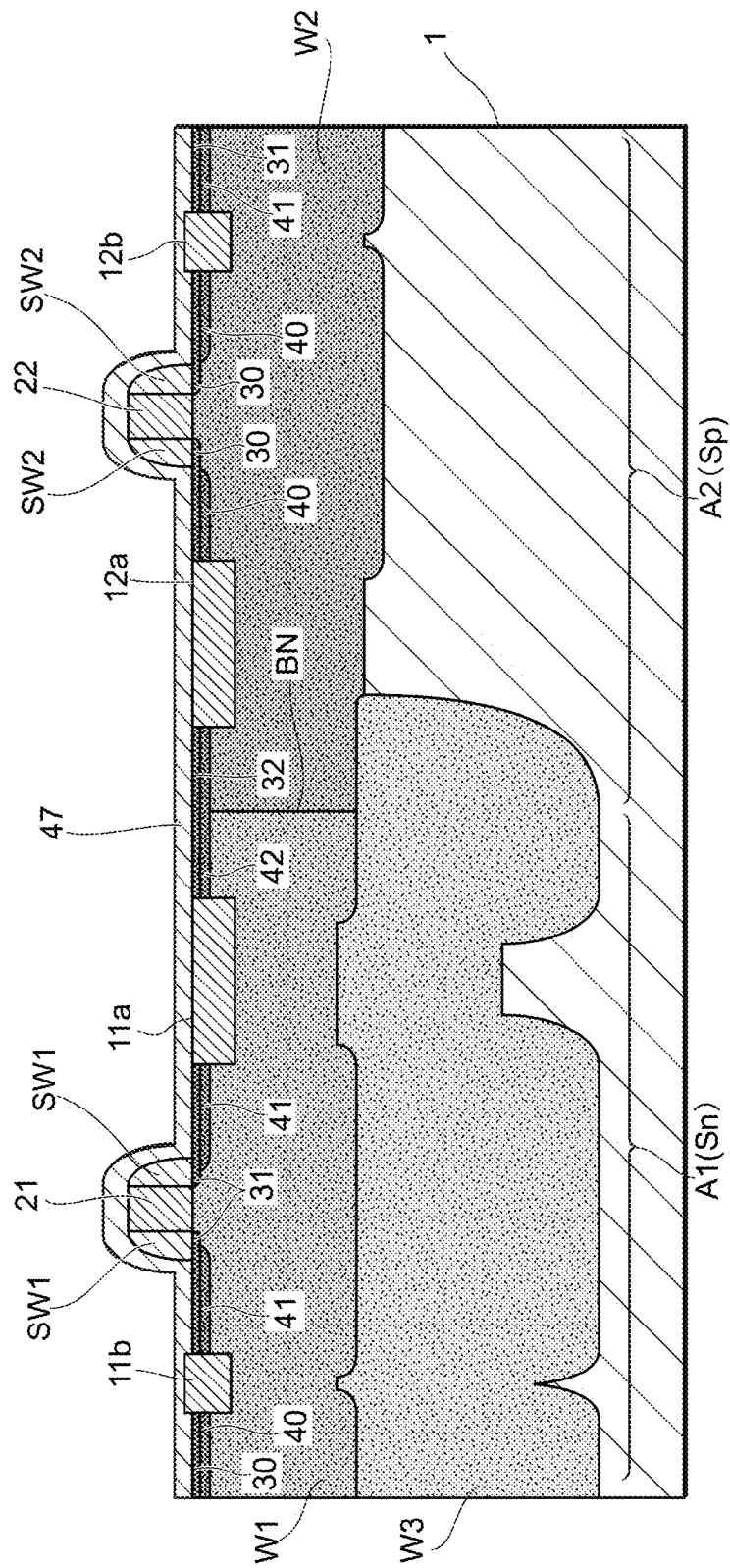
FIGS. 27 to 32 illustrate an example process flow (cross-sectional view corresponding to FIG. 4B) to show the manufacturing state of an example semiconductor device according to the fourth embodiment.

In FIG. 27, a silicide block insulating film 47 (e.g., $SiO_2$ film of about 35 nm in thickness) is next formed on the silicon substrate 1 of FIG. 22.

Figure 28:
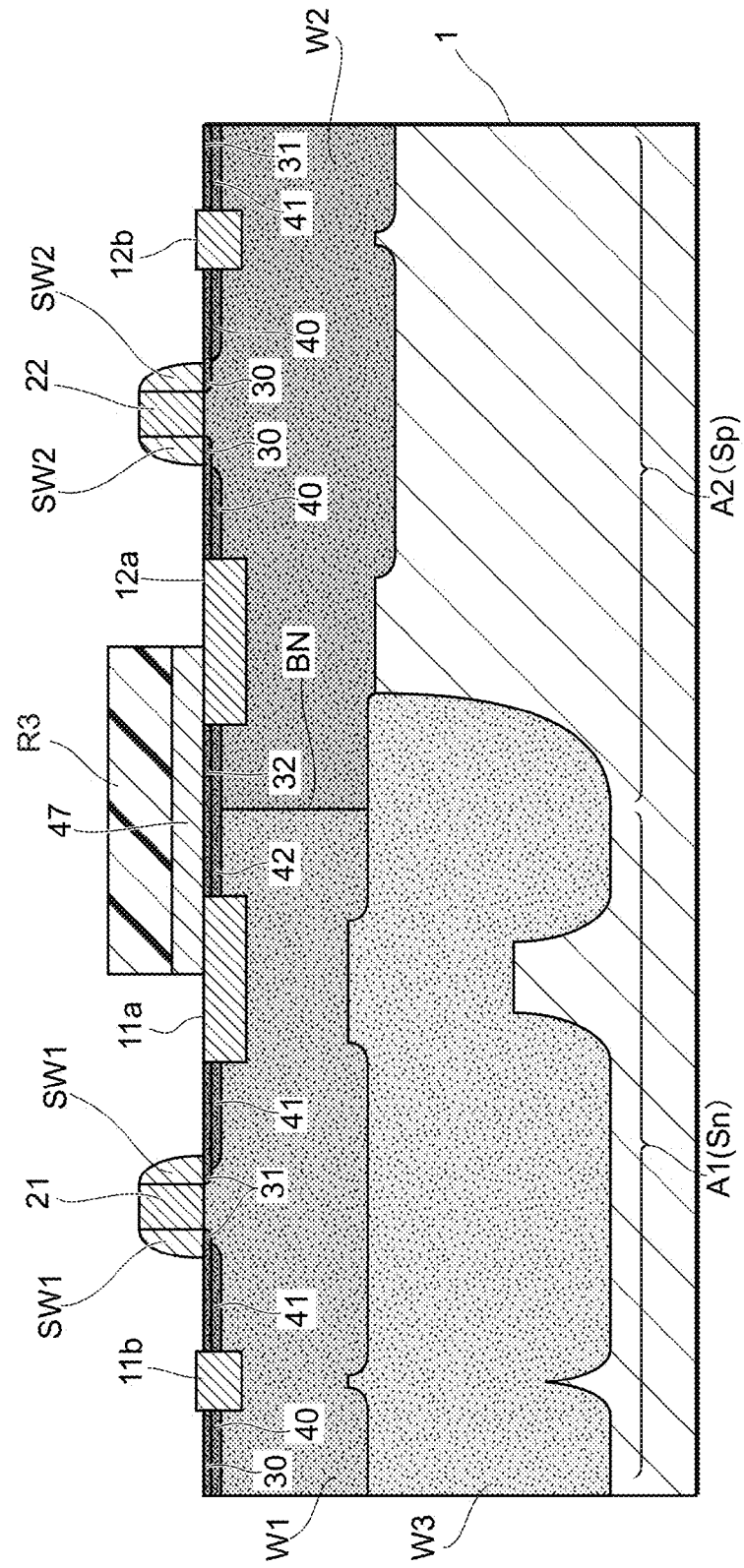

In FIG. 28, a part (a part covering the SD region 42 entirely) of the silicide block insulating film 47 is then covered with a resist mask R3, and the silicide block insulating film 47 is etched back.

Figure 29:
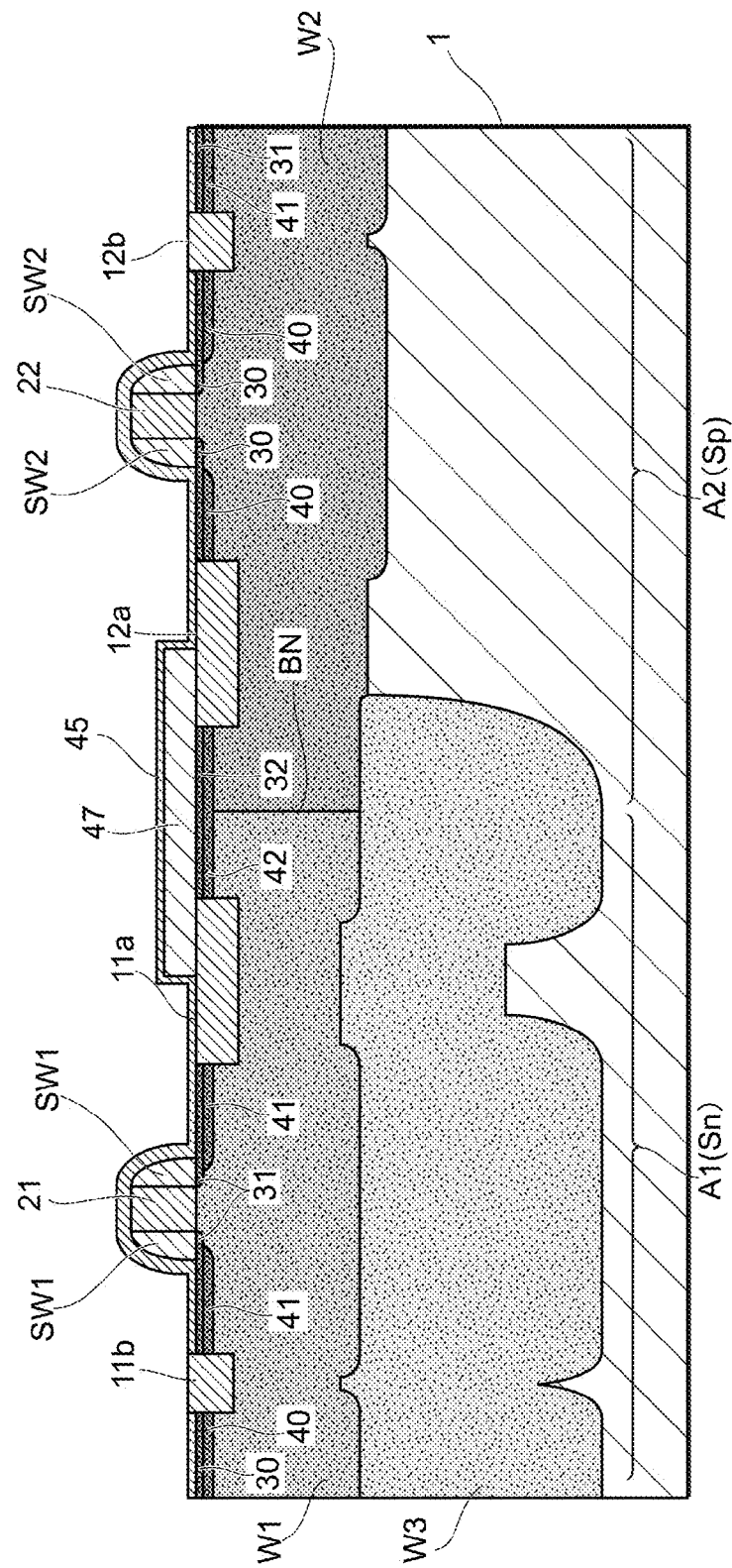

In FIG. 29, the resist mask R3 is next removed from the silicon substrate 1 of FIG. 28, on which a metal film 45 (e.g., Co film of about 6 nm and TiN film of about 30 nm) to form metal silicide for low resistance is formed.

Figure 30:
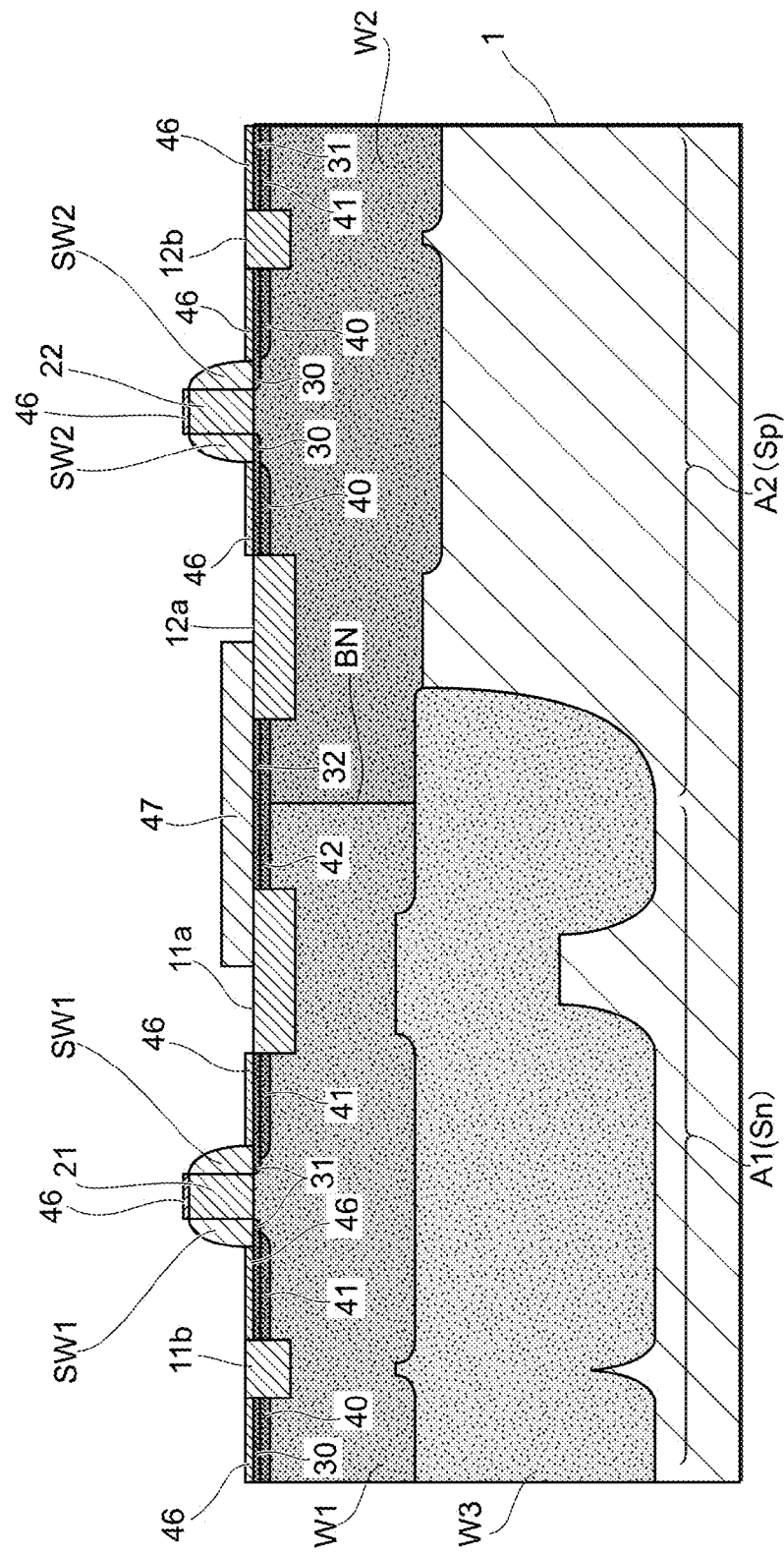

In FIG. 30, RTA (Rapid Thermal Anneal) at 540° C. under a nitrogen ($N_2$) atmosphere for 30 seconds, for example, wash-out using appropriate chemicals, and RTA at 750° C. under a nitrogen ($N_2$) atmosphere for 30 seconds, for example, are thereafter performed thereto to salicidize parts on top of the SD regions 40, 41 and 42 and the gate electrodes 21 and 22, thus forming metal silicide 46 ($CoSi_2$ film). Ni or Ti may be used as the silicide material depending on desired resistance and temperature characteristics, and in that case, the RTA is performed in a condition suitable for the formation of such metal silicide.

Figure 31:
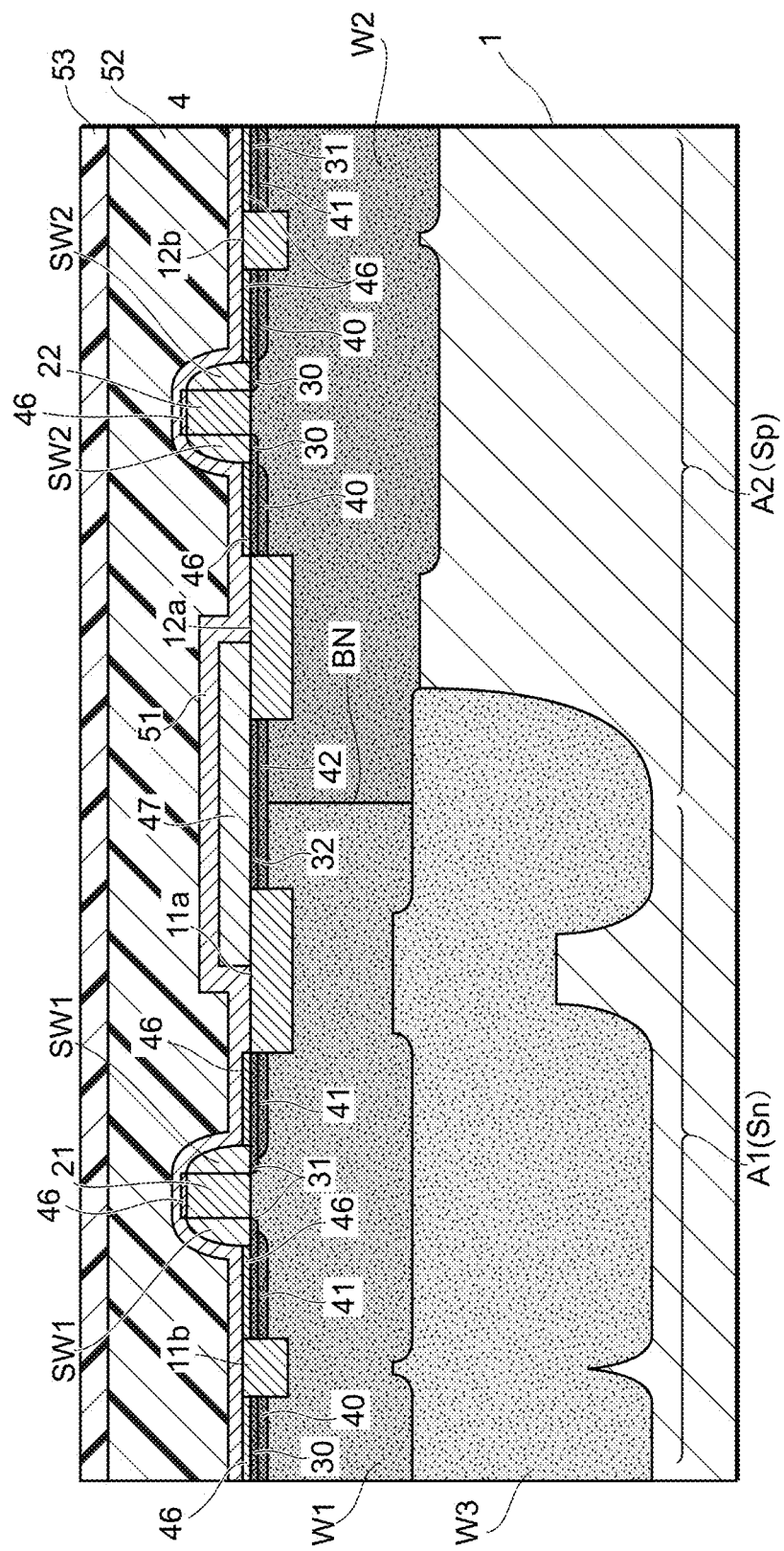

In FIG. 31, an inter-bulk layer dielectric film (e.g., $SiO_2$ film of about 20 nm in thickness) and a SiN film 51 (e.g., about 80 nm) are further formed along a side face and a top face of the gate electrodes 21 and 22 of FIG. 30 (i.e., so as to cover the gate electrodes along the gate-length direction) and so as to cover the surface of the silicon substrate 1 on which the metal silicide 46 and the silicide block insulating film 47 are formed. Then, an inter-bulk layer TEOS-BPSG film (e.g., about 1,300 nm in thickness) is formed on the SiN film 51, which is flattened by CMP, for example, thus forming an ILD 52 (interlayer dielectric film; e.g., having a thickness of 750 nm as the thickness of the BPSG film on the SiN film 51). An inter-bulk layer dielectric film 53 (e.g., $SiO_2$ film of about 100 nm in thickness) is further formed on the ILD 52.

Figure 32:
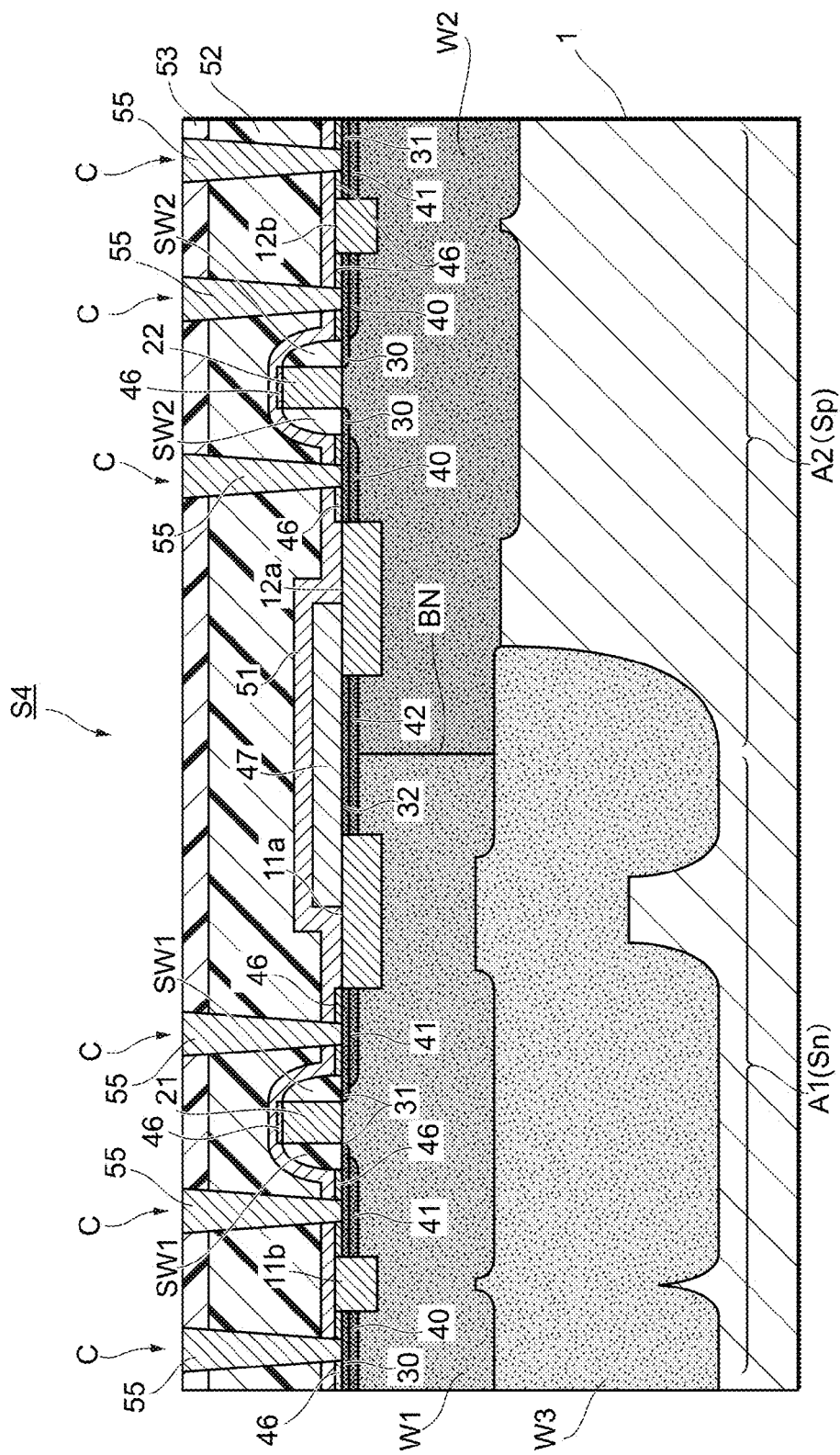

In FIG. 32, photolithography and etching are next performed thereto, thus forming contact holes C on the metal silicide 46 formed at the SD regions 40 and 41. Then a barrier metal film (Ti/TiN, Ta or the like) and a metal film (e.g., a film made of W, Al, Cu or the like) are formed on the silicon substrate 1 including the inner wall (sidewall and bottom wall) of these contact holes C, thus filling the contact holes C with the metal. Then, CMP is performed to the silicon substrate 1 to flatten the surface of the substrate, thus forming a basic structure of the semiconductor device S4 including metal contacts 55 formed therein.

According to the thus configured semiconductor device S4 and its manufacturing method as well, ion implantation is performed to form the P well W1 and the N well W3 as well as the N well W2 so that any of the element isolation films 11a, 11b, 12a and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 4B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity. Further, since it does not have the metal silicide 46 on the SD region 42, electrical insulation between the P well W1 and the N well W2 can be improved more.

Fifth Embodiment

Referring next to FIGS. 5A and 5B, the following describes the structure of an example semiconductor device S5 according to a fifth embodiment and the procedure in the manufacturing method therefor. The semiconductor device S5 has the same structure as that of the semiconductor device S4 illustrated in FIGS. 4A and 4B, except that it includes an element isolation film 11a disposed at a P well W1 that extends close to the boundary BN between the P well W1 and an N well W2, and that it does not have the element isolation film 12a of the N well W2, meaning that a SD region 42 is formed on the N well W2 side only.

The thus configured semiconductor device S4 can be manufactured by the same procedure in the manufacturing process of the semiconductor device S4 illustrated in FIGS. 14 to 22 and FIGS. 27 to 32, except that element isolation films 11a, 11b and 12b illustrated in FIG. 5B are formed in the silicon substrate 1 at the above step discussed in the context of FIG. 14 (the element isolation film 12a is not formed), and so the duplicated descriptions are omitted.

According to the thus configured semiconductor device S5 and its manufacturing method as well, ion implantation is performed to form the P well W1 and the N well W3 as well as the N well W2 so that any of the element isolation films 11a, 11b, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 5B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity. Further, since it does not have the metal silicide 46 on the SD region 42, electrical insulation between the P well W1 and the N well W2 can be improved even more.

Sixth Embodiment

Referring next to FIGS. 6A and 6B, the following describes the structure of an example semiconductor device S6 according to a sixth embodiment and the procedure in the manufacturing method therefor. The semiconductor device S6 has the same structure as that of the semiconductor device S4 illustrated in FIGS. 4A and 4B, except that it includes an element isolation film 12a disposed at an N well W2 that extends close to the boundary BN between a P well W1 and the N well W2, and that it does not have the element isolation film 11a of the P well W1, meaning that a SD region 42 is formed on the P well W1 side only.

The thus configured semiconductor device S6 can be manufactured by the same procedure in the manufacturing process of the semiconductor device S4 illustrated in FIGS. 14 to 22 and FIGS. 27 to 32 except that element isolation films 11b, 12a and 12b illustrated in FIG. 6B are formed in the silicon substrate 1 at the above step discussed in the context of FIG. 14 (the element isolation film 11a is not formed), and so the duplicated descriptions are omitted.

According to the thus configured semiconductor device S6 and its manufacturing method as well, ion implantation is performed to form the P well W1 and the N well W3 as well as the N well W2 so that any of the element isolation films 11b, 12a, and 12b have a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 6B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity. Further, since it does not have the metal silicide 46 on the SD region 42, electrical insulation between the P well W1 and the N well W2 can be improved even more.

Seventh Embodiment

Referring next to FIGS. 7A and 7B, as well as to FIGS. 14-20 and 33-38, the following describes the structure of an example semiconductor device S7 according to a seventh embodiment and the procedure in the manufacturing method therefor. The semiconductor device S7 has the same structure as that of the semiconductor device 51 illustrated in FIGS. 1A and 1B, except that it includes a LDD region 32 instead of the SD region 42 located between element isolation films 11a and 12a, it does not include metal silicide 46 on the LDD region 32, and it has a silicide block insulating film 47 between the LDD region 32 and a SiN film 51.

The following describes a specific structure of the thus configured semiconductor device S7 and an exemplary manufacturing process thereof in details. Herein, the procedure illustrated in FIGS. 14 to 20 in the manufacturing process of the semiconductor device S1 of the first embodiment is first performed (until the formation of the LDD regions 30, 31 and 32).

Figure 33:
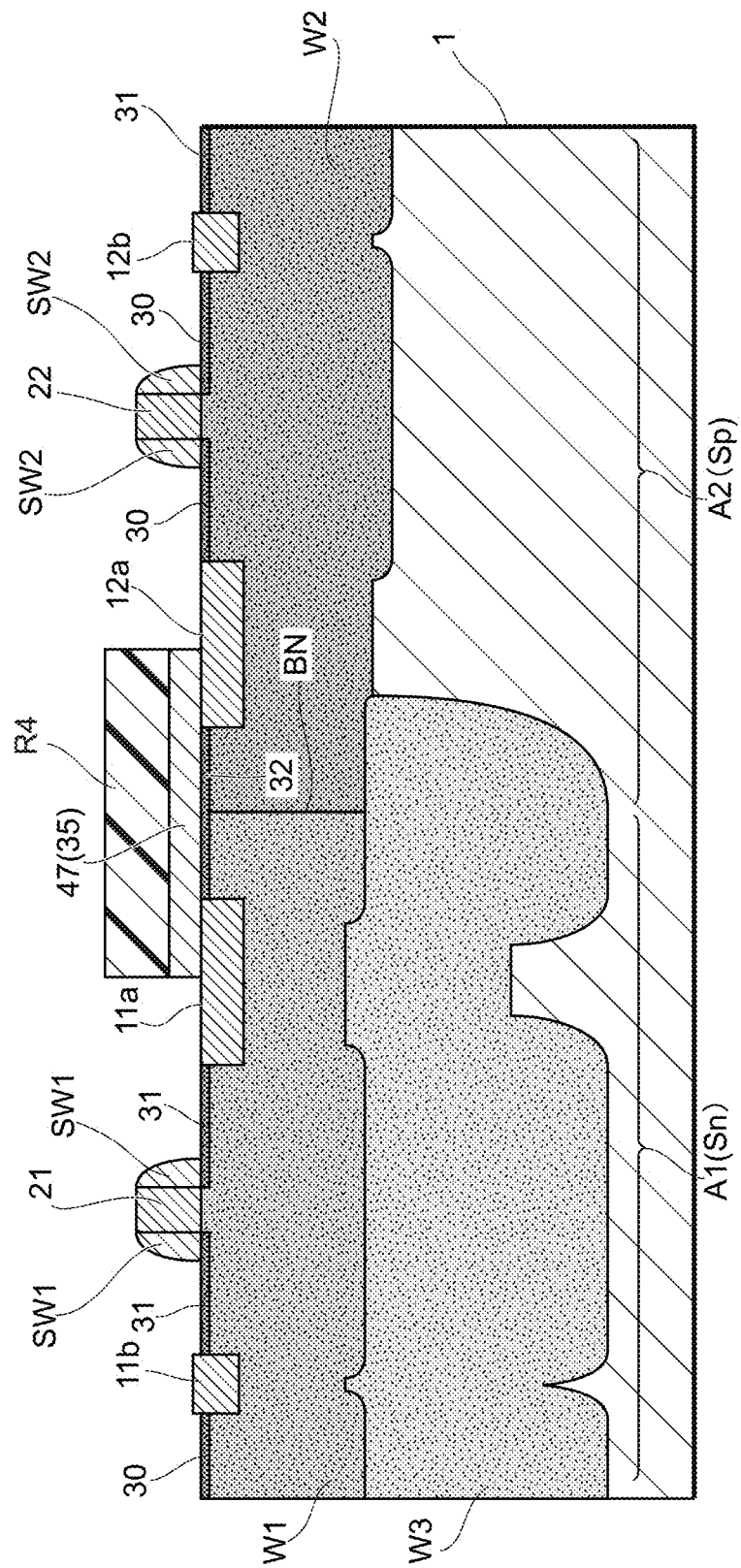
FIGS. 33 to 38 illustrate an example process flow (cross-sectional view corresponding to FIG. 7B) to show the manufacturing state of an example semiconductor device according to the seventh embodiment.

In FIG. 33, a part (a part covering the LDD region 32 entirely) of the sidewall insulating film 35 is then covered with a resist mask R4, and the sidewall insulating film 35 is etched back. This forms sidewalls SW1 and SW2 of the gate electrodes 21 and 22, and a part of the sidewall insulating film 35 that is not etched due to the resist mark R4 serves as a silicide block insulating film 47 in the following procedure.

Figure 34:
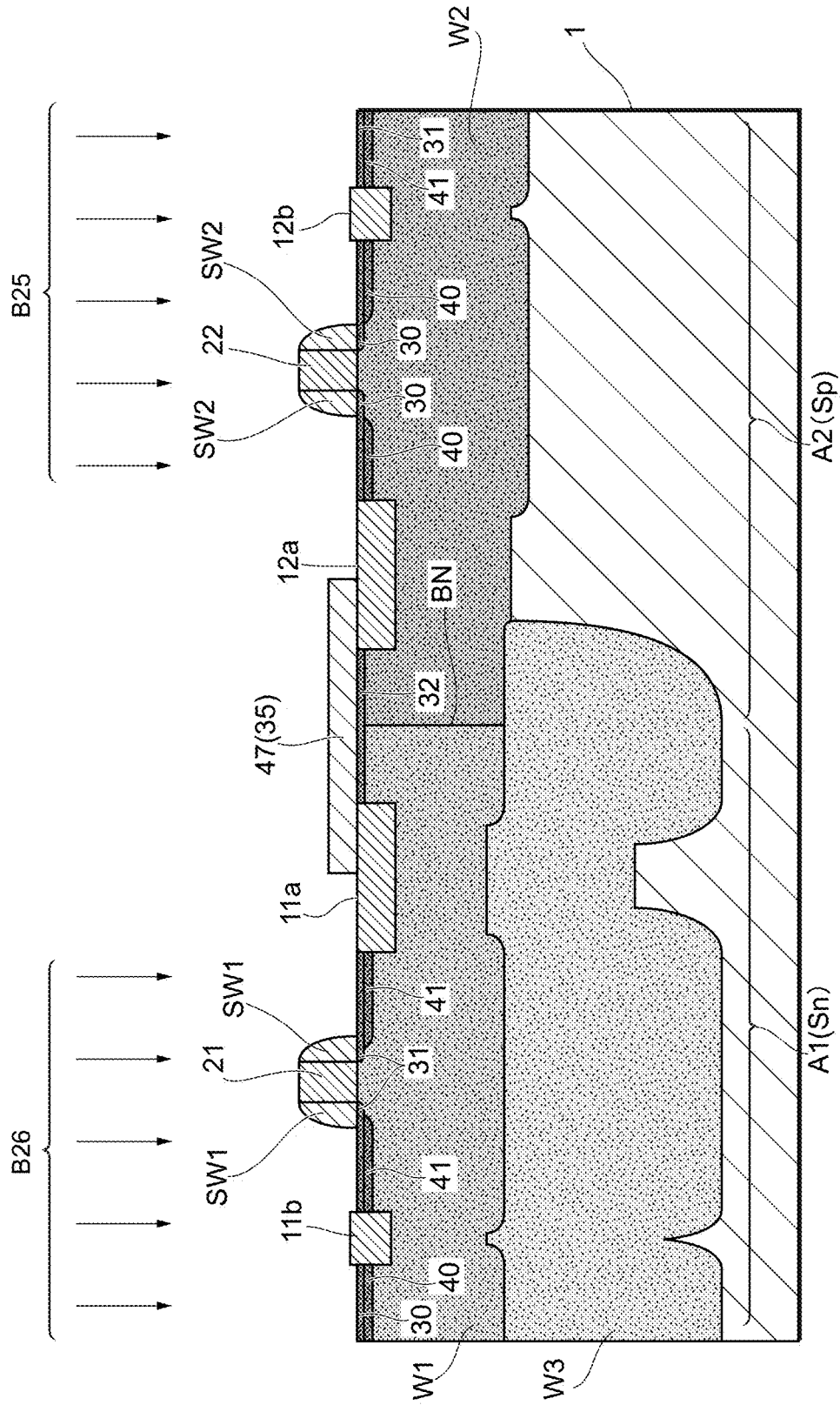

In FIG. 34, after removing the resist mask R4 from the silicon substrate 1 of FIG. 33, ion implantation to the LDD regions 30 and 31 is next performed alternately while covering a non-implantation region with resist selectively. After that, activation-annealing is performed to form SD regions 40 and 41. Due to the presence the silicide block insulating film 47, ions are not implanted at the LDD region 32 irrespective of the presence or not of resist, and so a SD region is not formed at that part. Ion implantation may be performed in a condition similar to that of FIG. 22. For instance, the P-type SD region 40 can be formed based on the P-type LDD region 30 by using an ion beam B25 of boron of 5 keV, $2.0\times10^{15}$ $cm^{-2}$. At this time, a non-implantation region of the ion beam B25 is covered with resist. The N-type SD region 41 can be formed based on the N-type LDD region 31 by using an ion beam B26 of phosphorus of 15 keV, $2.0\times10^{15}$ $cm^{-2}$. At this time, a non-implantation region of the ion beam B26 is covered with resist. The activation-annealing is performed at 1,000° C. in nitrogen ($N_2$) for 20 seconds, for example.

Figure 35:
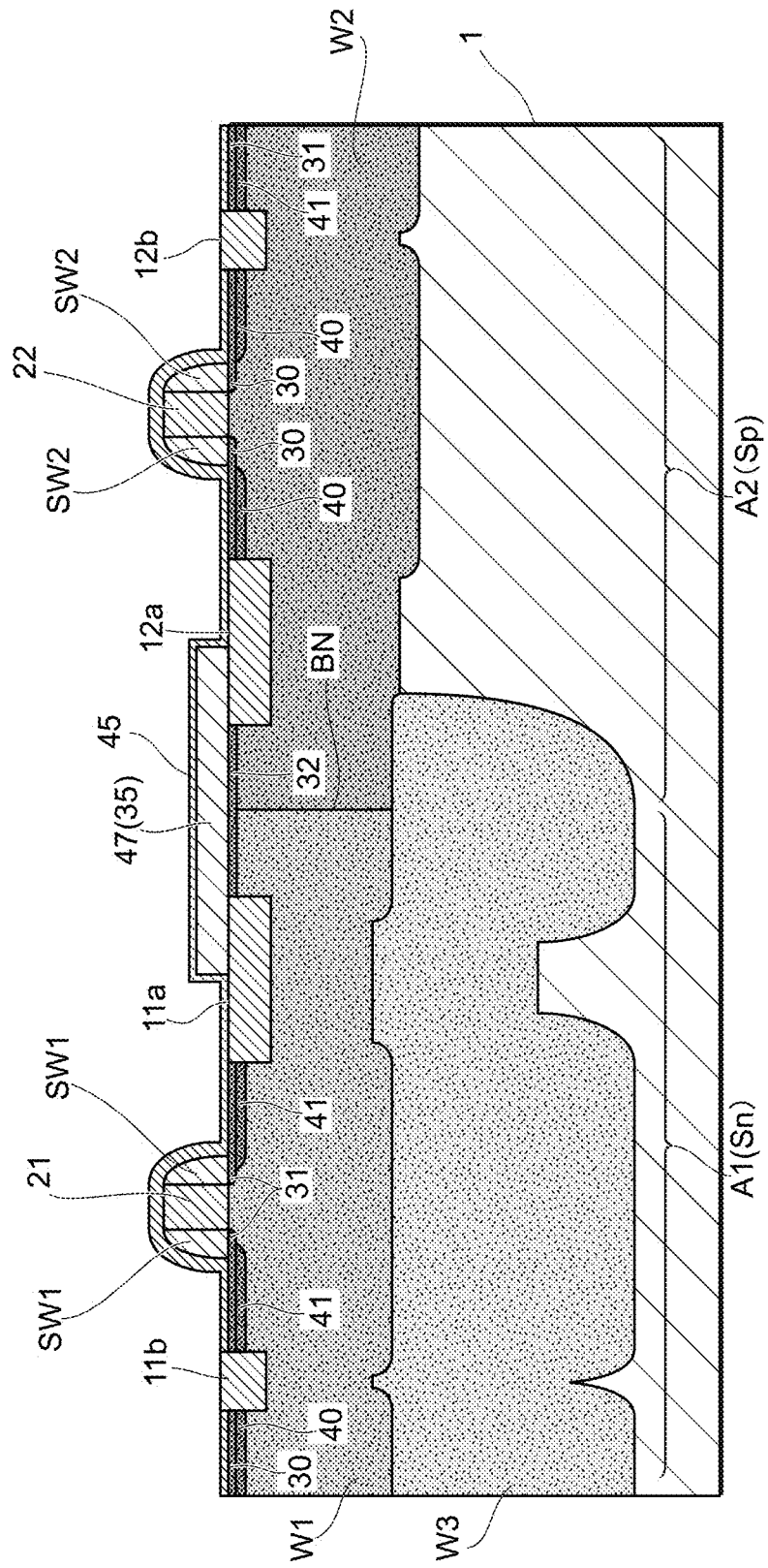

In FIG. 35, a metal film 45 (e.g., Co film of about 6 nm and TiN film of about 30 nm) to form metal silicide for low resistance is then formed on the silicon substrate 1 of FIG. 34.

Figure 36:
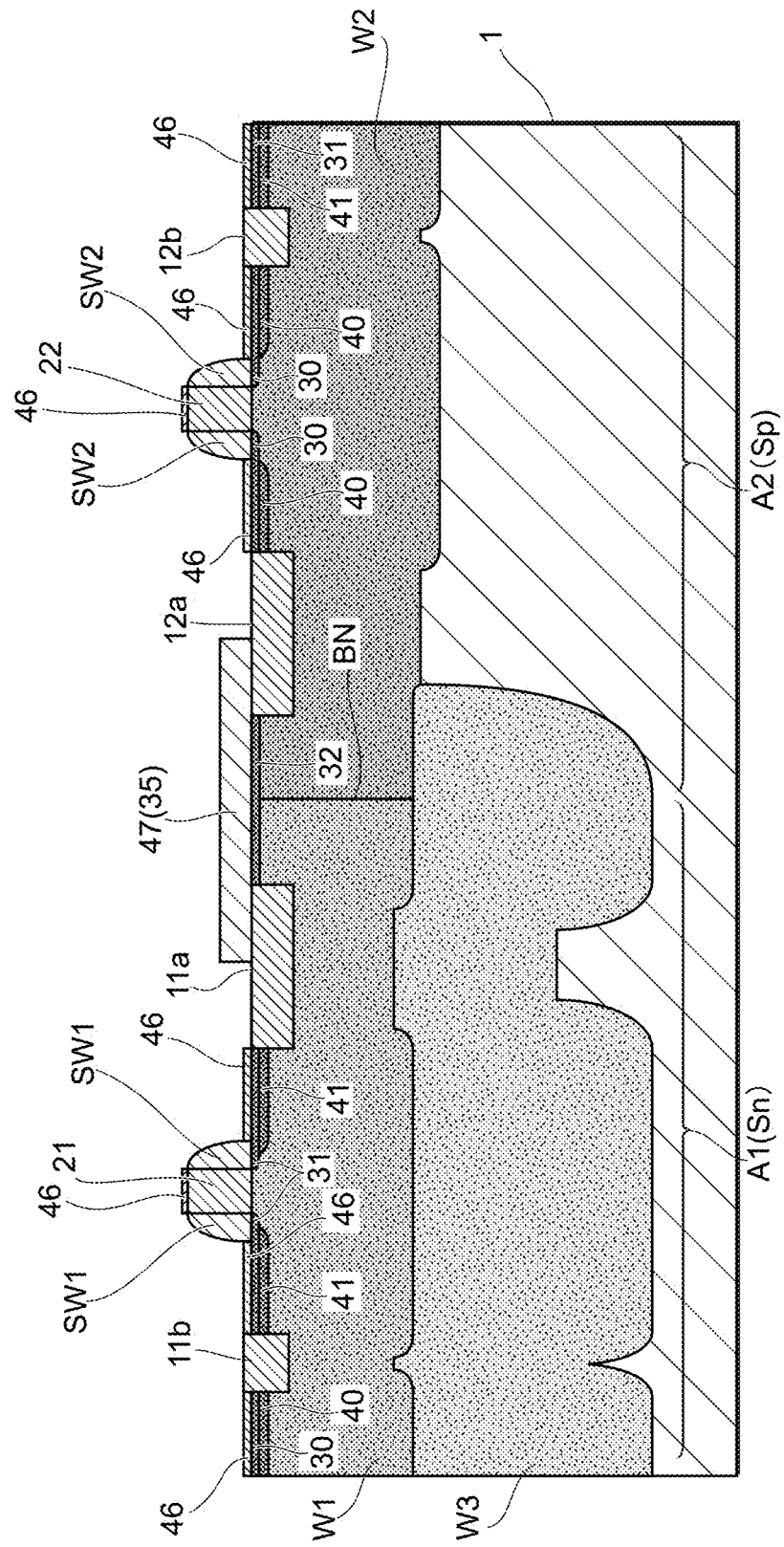

In FIG. 36, RTA (Rapid Thermal Anneal) at 540° C. under a nitrogen ($N_2$) atmosphere for 30 seconds, for example, wash-out using appropriate chemicals, and RTA at 750° C. under a nitrogen ($N_2$) atmosphere for 30 seconds, for example, are thereafter performed thereto to salicidize parts on top of the SD regions 40 and 41, the LDD region 32 and the gate electrodes 21 and 22, thus forming metal silicide 46 ($CoSi_2$ film). Ni or Ti may be used as the silicide material depending on desired resistance and temperature characteristics, and in that case, the RTA is performed in a condition suitable for the formation of such metal silicide.

Figure 37:
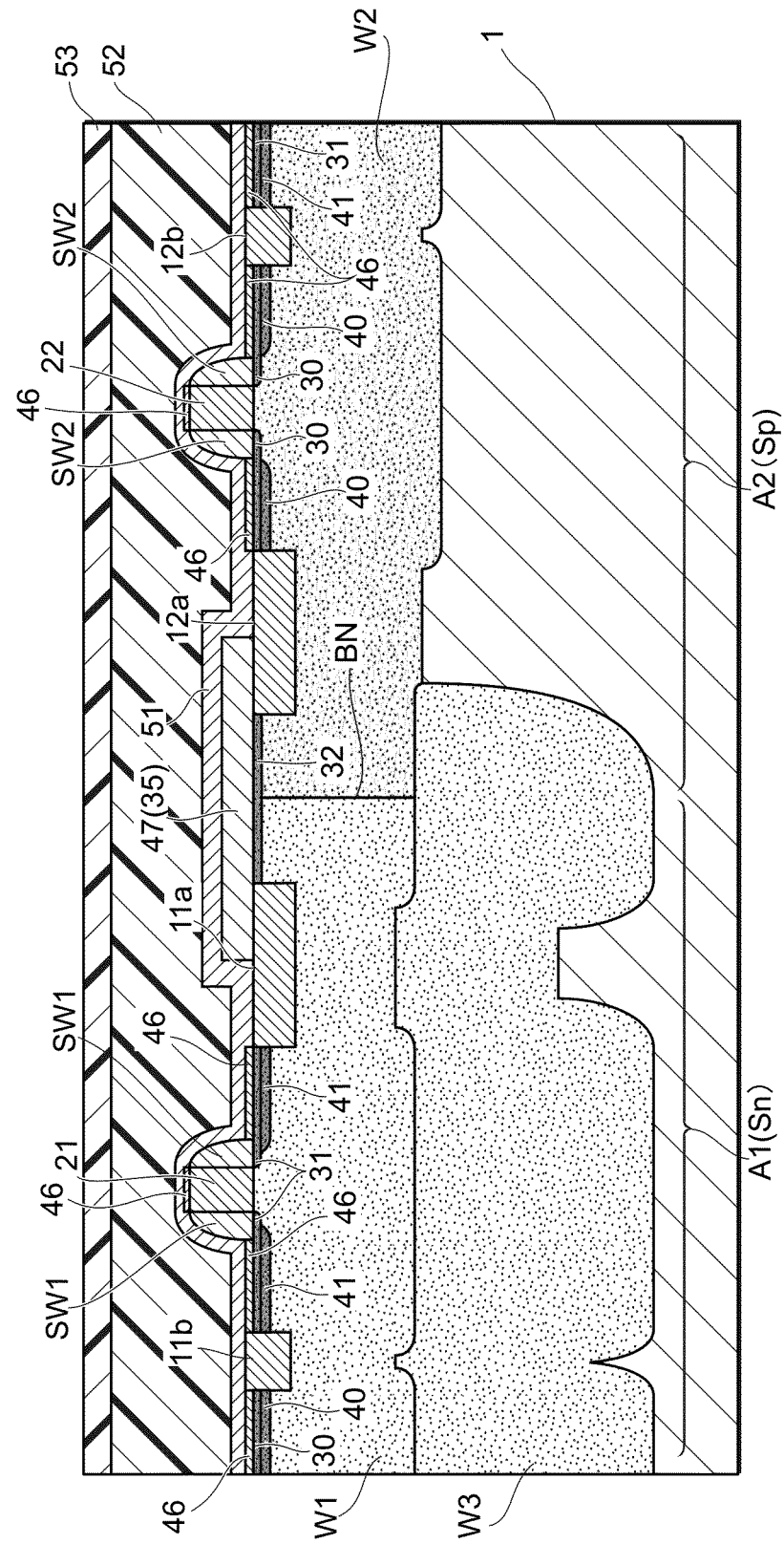

In FIG. 37, Further an inter-bulk layer dielectric film (e.g., $SiO_2$ film of about 20 nm in thickness) and a SiN film 51 (e.g., about 80 nm) are formed along a side face and a top face of the gate electrodes 21 and 22 of FIG. 36 (i.e., so as to cover the gate electrodes along the gate-length direction) and so as to cover the surface of the silicon substrate 1 on which the metal silicide 46 and the silicide block insulating film 47 are formed. Then, an inter-bulk layer TEOS-BPSG film (e.g., about 1,300 nm in thickness) is formed on the SiN film 51, which is flattened by CMP, for example, thus forming an ILD 52 (interlayer dielectric film; e.g., having a thickness of 750 nm as the thickness of the BPSG film on the SiN film 51). An inter-bulk layer dielectric film 53 (e.g., $SiO_2$ film of about 100 nm in thickness) is further formed on the ILD 52.

Figure 38:
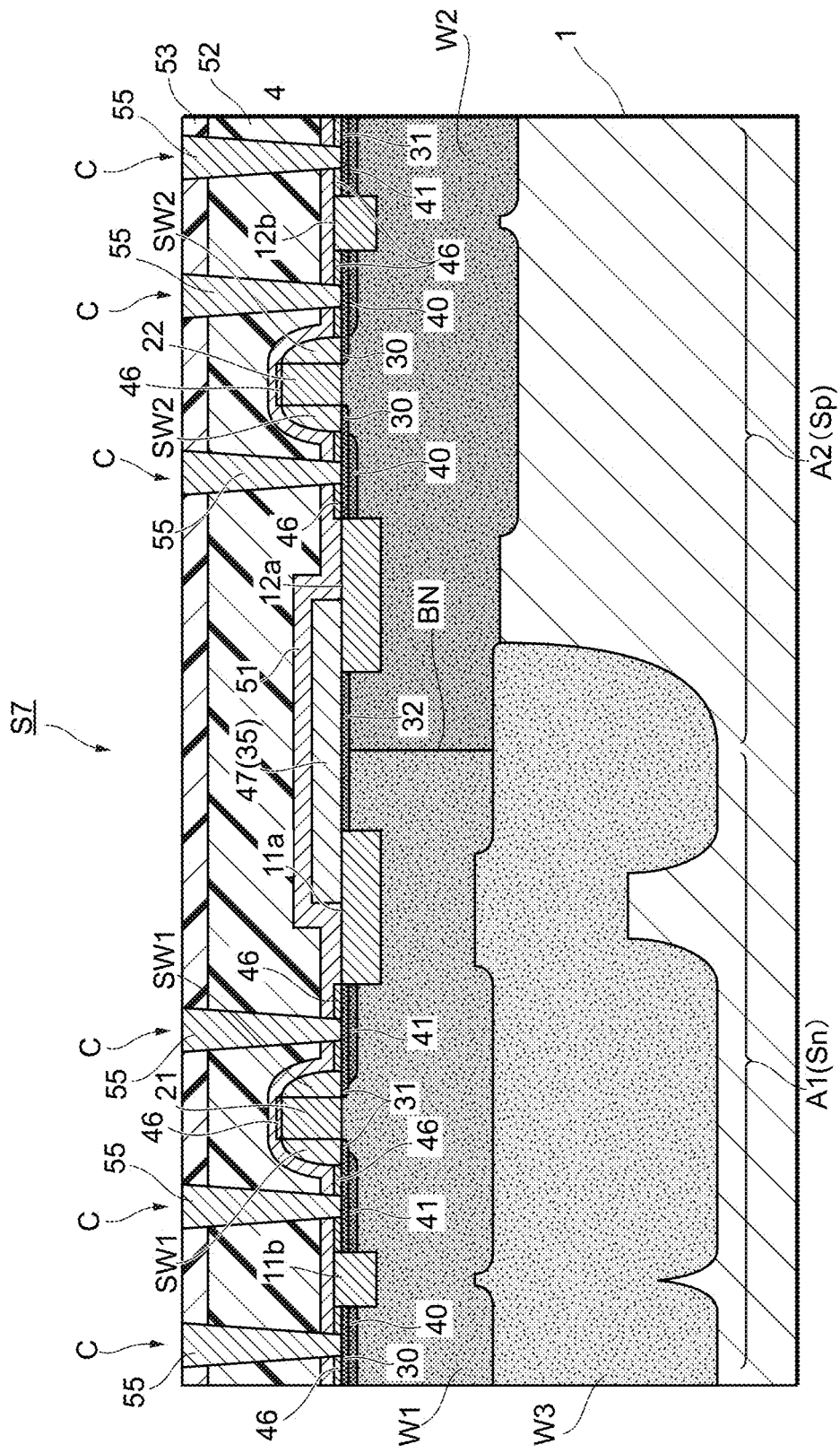

In FIG. 38, photolithography and etching are next performed thereto, thus forming contact holes C on the metal silicide 46 formed at the SD regions 40 and 41. Then a barrier metal film (Ti/TiN, Ta or the like) and a metal film (e.g., a film made of W, Al, Cu or the like) are formed on the silicon substrate 1 including the inner wall (sidewall and bottom wall) of these contact holes C, thus filling the contact holes C with the metal. Then, CMP is performed to the silicon substrate 1 to flatten the surface of the substrate, thus forming a basic structure of the semiconductor device S7 including metal contacts 55 formed therein.

According to the thus configured semiconductor device S7 and its manufacturing method as well, ion implantation is performed to form the P well W1 and the N well W3 as well as the N well W2 so that any of the element isolation films 11a, 11b, 12a, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 7B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Eighth Embodiment

Referring next to FIGS. 8A and 8B, the following describes the structure of an example semiconductor device S8 according to an eight embodiment and the procedure in the manufacturing method therefor. The semiconductor device S8 has the same structure as that of the semiconductor device S7 illustrated in FIGS. 7A and 7B, except that it includes an element isolation film 11a disposed at a P well W1 that extends close to the boundary BN between the P well W1 and an N well W2, and that it does not have the element isolation film 12a of the N well W2, meaning that a LDD region 32 is formed on the N well W2 side only.

The thus configured semiconductor device S8 can be manufactured by the same procedure in the manufacturing process of the semiconductor device S7 illustrated in FIGS. 14-20 and 33-38 except that element isolation films 11a, 11b and 12b illustrated in FIG. 8B are formed in the silicon substrate 1 at the above step discussed in the context of FIG. 14 (the element isolation film 12a is not formed), and so the duplicated descriptions are omitted.

According to the thus configured semiconductor device S8 and its manufacturing method as well, ion implantation is performed to form the P well W1 and the N well W3 as well as the N well W2 so that any of the element isolation films 11a, 11b, and 12b have a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 8B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Ninth Embodiment

Referring next to FIGS. 9A and 9B, the following describes the structure of an example semiconductor device S9 according to a ninth embodiment and the procedure in the manufacturing method therefor. The semiconductor device S9 has the same structure as that of the semiconductor device S7 illustrated in FIGS. 7A and 7B, except that it includes an element isolation film 12a disposed at an N well W2 that extends close to the boundary BN between a P well W1 and the N well W2, and that it does not have the element isolation film 11a of the P well W1, meaning that a LDD region 32 is formed on the P well W1 side only.

The thus configured semiconductor device S9 can be manufactured by the same procedure in the manufacturing process of the semiconductor device S7 illustrated in FIGS. 14-20 and 33 38, except that element isolation films 11b, 12a and 12b illustrated in FIG. 9B are formed in the silicon substrate 1 at the above step discussed in the context of FIG. 14 (the element isolation film 11a is not formed), and so the duplicated descriptions are omitted.

According to the thus configured semiconductor device S9 and its manufacturing method as well, ion implantation is performed to form the P well W1 and the N well W3 as well as the N well W2 so that any of the element isolation films 11b, 12a, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 9B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Tenth Embodiment

Referring next to FIGS. 10A and 10B, as well as FIGS. 14-18 and 39-46, the following describes the structure of an example semiconductor device S10 according to a tenth embodiment and the procedure in the manufacturing method therefor. The semiconductor device S10 has the same structure as that of the semiconductor device S1 illustrated in FIGS. 1A and 1B, except that it does not include the SD region 42 located between element isolation films 11a and 12a and the metal silicide 46, and it has a silicide block insulating film 47 between the surface of the silicon substrate 1 and a SiN film 51.

The following describes a specific structure of the thus configured semiconductor device S10 and an exemplary manufacturing process thereof in details. Herein, the procedure illustrated in FIGS. 14-18 in the manufacturing process of the semiconductor device S1 of the first embodiment is first performed (until the patterning of the gate electrodes 21 and 22).

Figure 39:
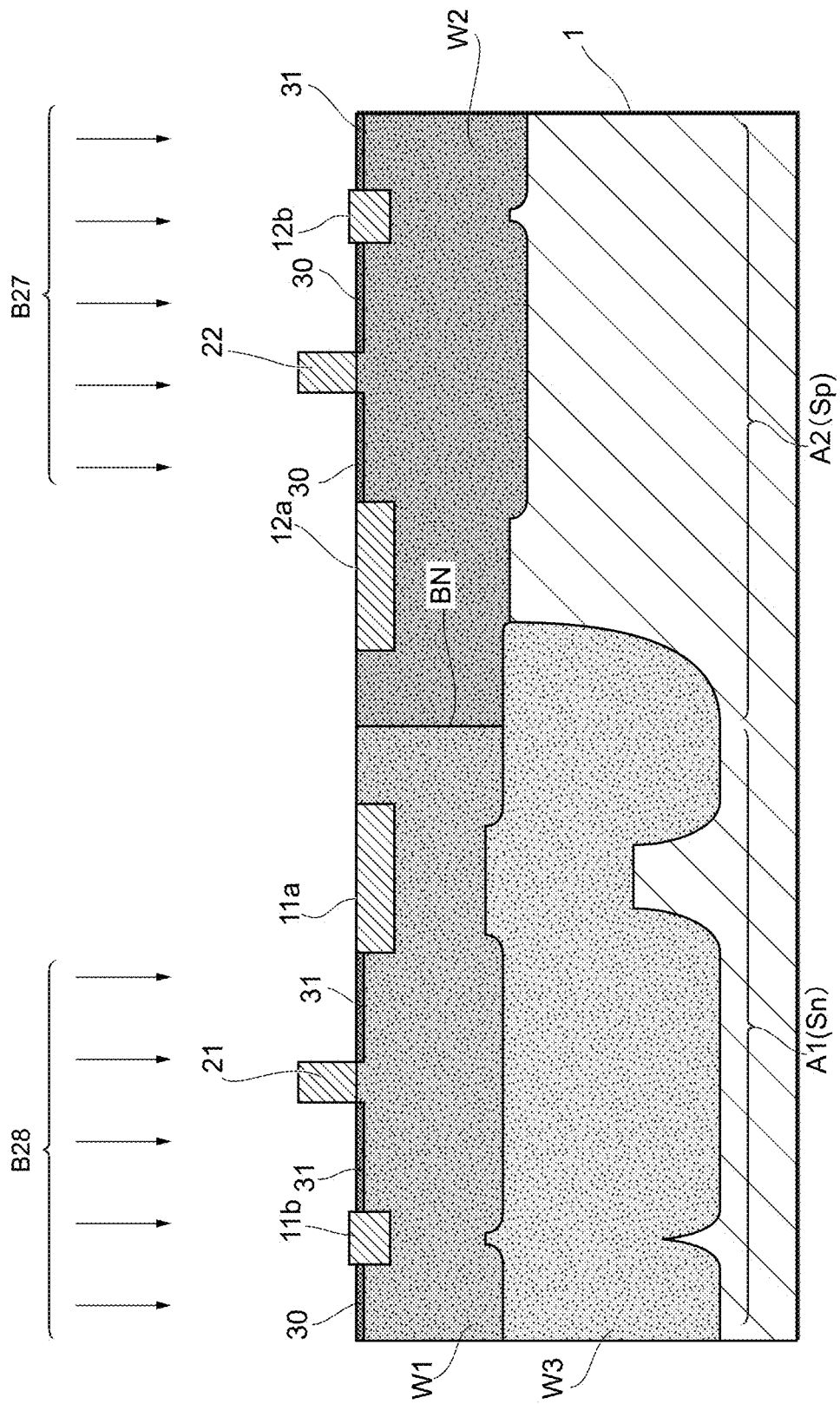

In FIG. 39, ion implantation to form a P-type LDD (Lightly Doped Drain) region 30 (PLDD) at the P well W1 and an N-type LDD region 31 (NLDD) at the N well W2 is next performed alternately while covering a non-implantation region with resist selectively. For instance, the P-type LDD region 30 can be formed by using an ion beam B27 of boron fluoride ($BF_2$) of 80 keV, $4.5 \times 10^{13}$ cm$^{-2}$. At this time, a non-implantation region of the ion beam B27 is covered with resist. The N-type LDD region 31 can be formed by using an ion beam B28 of phosphorus of 35 keV, $4.0 \times 10^{13}$ cm$^{-2}$.

Figure 40:
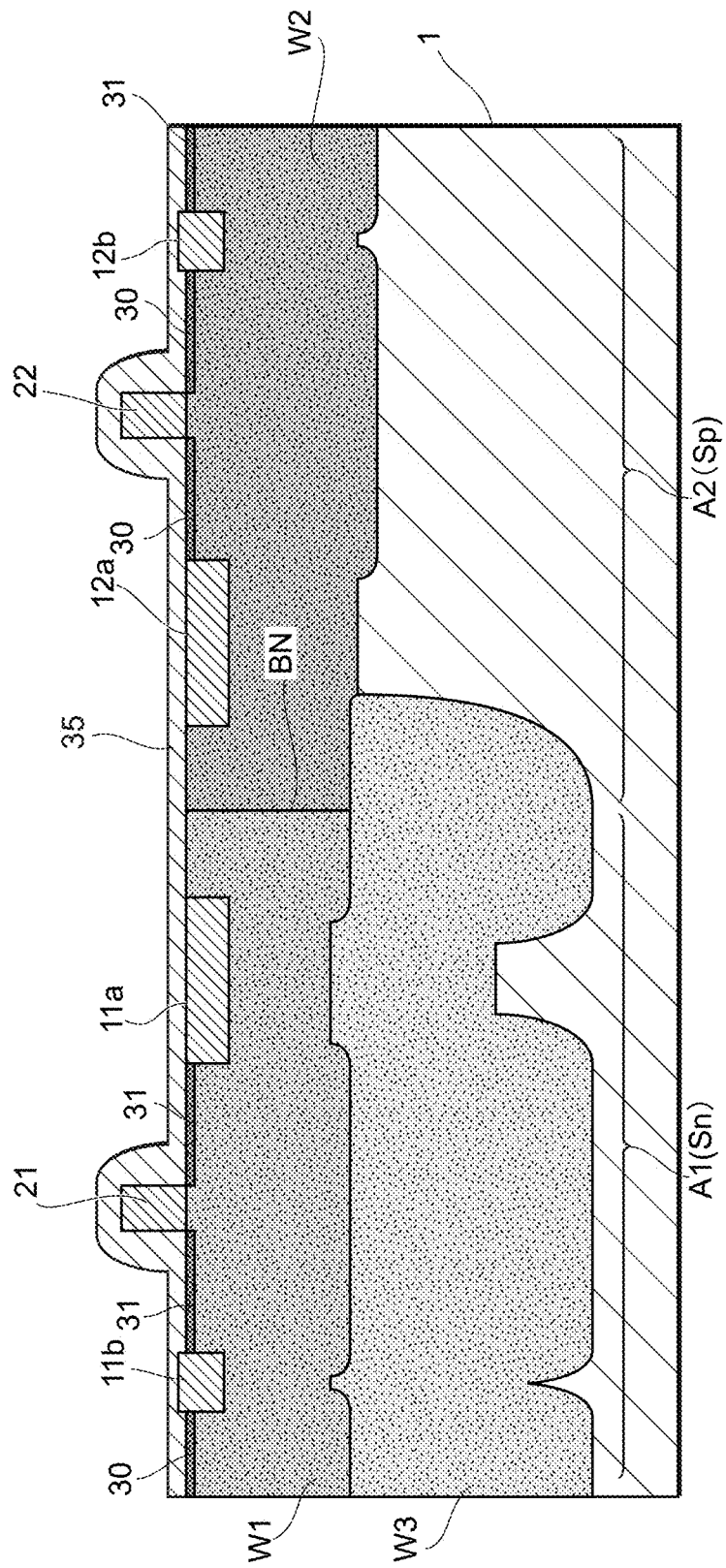

In FIG. 40, a sidewall insulating film 35 (e.g., SiN film or $SiO_2$ film of about 100 nm in thickness) is formed on the silicon substrate 1 of FIG. 39, which is to form sidewalls of the gate electrodes 21 and 22.

Figure 41:
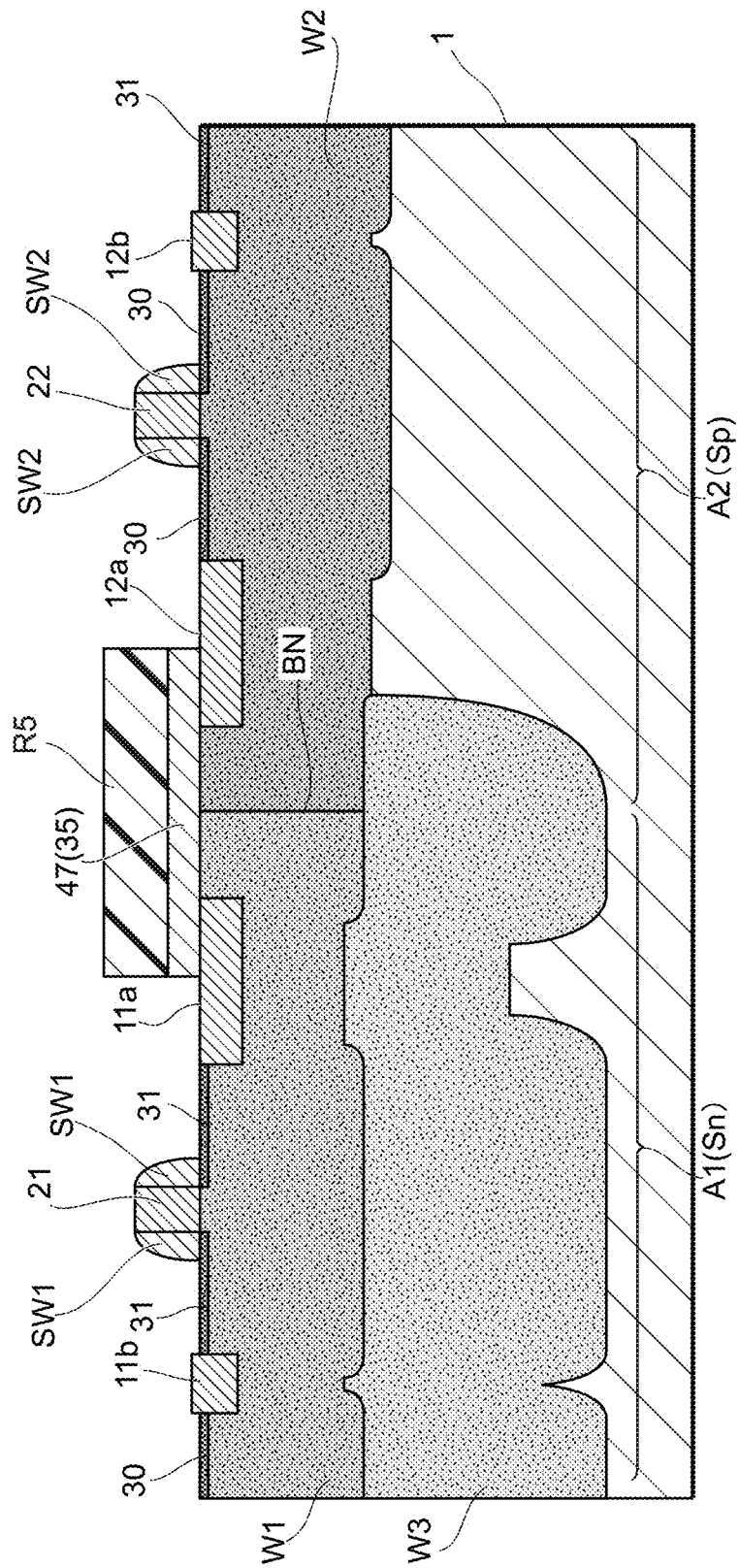

In FIG. 41, a part of the sidewall insulating film 35 (a part covering between the element isolation films 11a and 12a) is then covered with a resist mask R5 and the sidewall insulating film 35 is etched back. This forms sidewalls SW1 and SW2 of the gate electrodes 21 and 22, and a part of the sidewall insulating film 35 that is not etched due to the resist mark R5 serves as a silicide block insulating film 47 in the following procedure.

Figure 42:
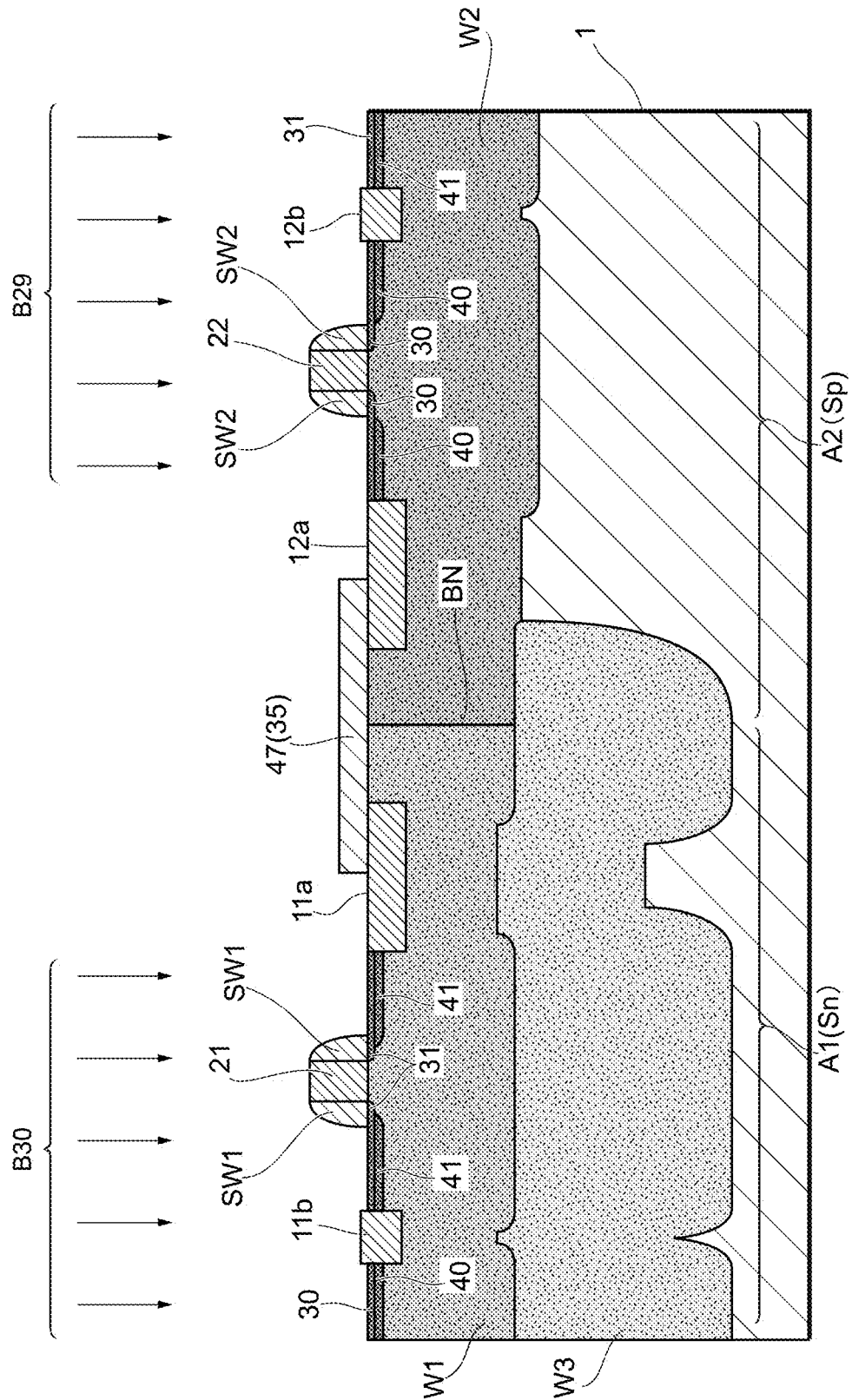

In FIG. 42, after removing the resist mask R5 from the silicon substrate 1 in the state of FIG. 41, ion implantation to the LDD regions 30 and 31 is next performed alternately while covering a non-implantation region with resist selectively. After that, activation-annealing is performed to form SD regions 40 and 41. Due to the presence of the silicide block insulating film 47, ions are not implanted at the region between the element isolation films 11a and 12a irrespective of the presence of not of the resist, and so a SD region is not formed at that part. Ion implantation may be performed in a condition similar to that of FIG. 22. For instance, the P-type SD region 40 can be formed based on the P-type LDD region 30 by using an ion beam B29 of boron of 5 keV, $2.0 \times 10^{15}$ cm$^{-2}$. At this time, a non-implantation region of the ion beam B29 is covered with resist. The N-type SD region 41 can be formed based on the N-type LDD region 31 by using an ion beam B30 of phosphorus of 15 keV, $2.0 \times 10^{15}$ cm$^{-2}$. At this time, a non-implantation region of the ion beam B30 is covered with resist. The activation-annealing is performed at 1,000° C. in nitrogen ($N_2$) for 20 seconds, for example.

Figure 43:
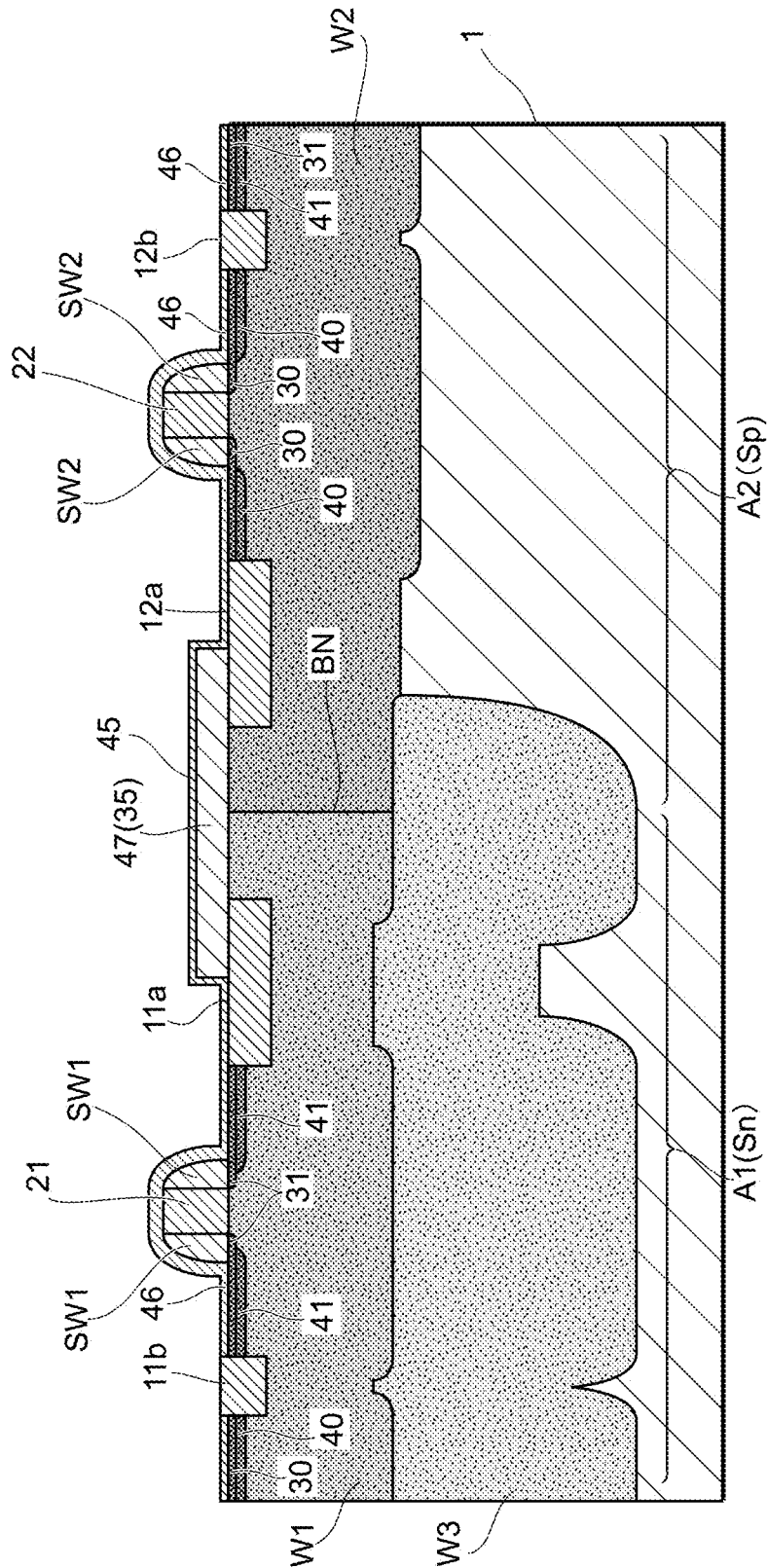

In FIG. 43, a metal film 45 (e.g., Co film of about 6 nm and TiN film of about 30 nm) to form metal silicide for low resistance is then formed on the silicon substrate 1 in the state of FIG. 42.

Figure 44:
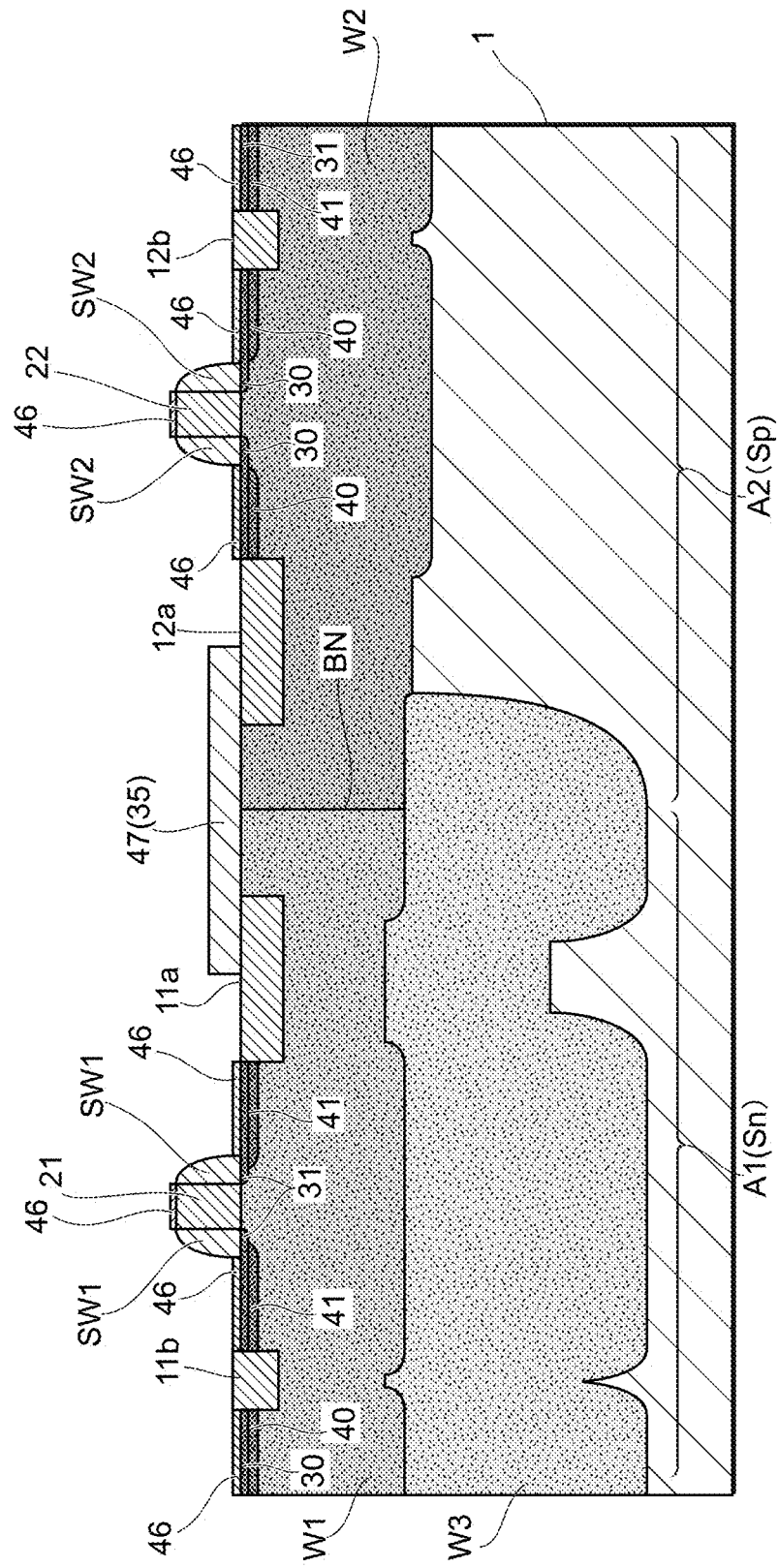

In FIG. 44, RTA (Rapid Thermal Anneal) at 540° C. under a nitrogen ($N_2$) atmosphere for 30 seconds, for example, wash-out using appropriate chemicals, and RTA at 750° C. under a nitrogen ($N_2$) atmosphere for 30 seconds, for example, are thereafter performed thereto to salicidize parts on top of the SD regions 40 and 41 and the gate electrodes 21 and 22, thus forming metal silicide 46 ($CoSi_2$ film). Ni or Ti may be used as the silicide material depending on desired resistance and temperature characteristics, and in that case, the RTA is performed in a condition suitable for the formation of such metal silicide.

Figure 45:
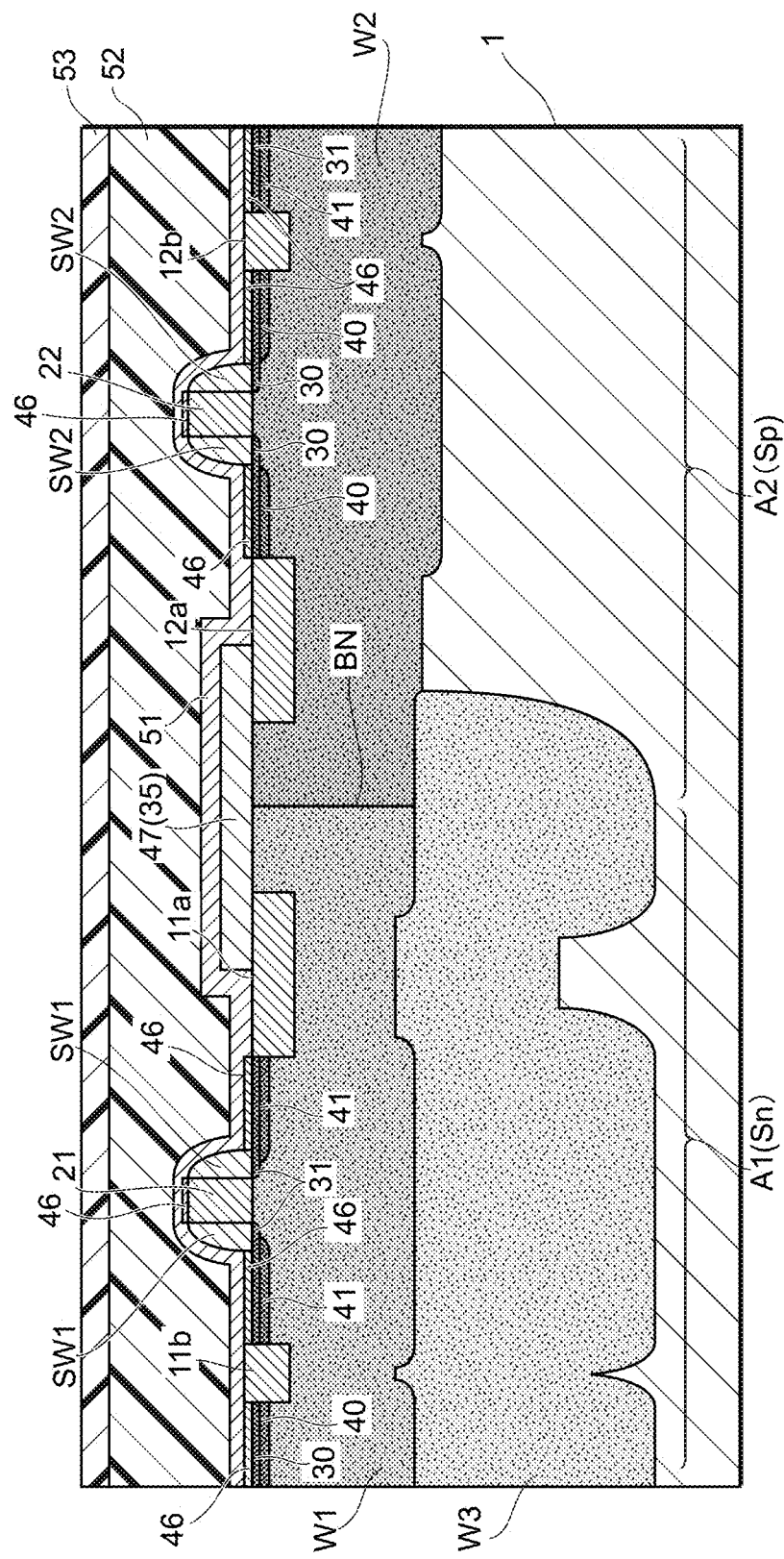

In FIG. 45, an inter-bulk layer dielectric film (e.g., $SiO_2$ film of about 20 nm in thickness) and a SiN film 51 (e.g., about 80 nm) are further formed along a side face and a top face of the gate electrodes 21 and 22 in the state of FIG. 44 (i.e., so as to cover the gate electrodes along the gate-length direction) and so as to cover the surface of the silicon substrate 1 on which the metal silicide 46 and the silicide block insulating film 47 are formed. Then, an inter-bulk layer TEOS-BPSG film (e.g., about 1,300 nm in thickness) is formed on the SiN film 51, which is flattened by CMP, for example, thus forming an ILD 52 (interlayer dielectric film; e.g., having a thickness of 750 nm as the thickness of the BPSG film on the SiN film 51). An inter-bulk layer dielectric film 53 (e.g., $SiO_2$ film of about 100 nm in thickness) is further formed on the ILD 52.

In FIG. 46, photolithography and etching are performed thereto, thus forming contact holes C on the metal silicide 46 formed at the SD regions 40 and 41. Then a barrier metal film (Ti/TiN, Ta or the like) and a metal film (e.g., a film made of W, Al, Cu or the like) are formed on the silicon substrate 1 including the inner wall (sidewall and bottom wall) of these contact holes C, thus filling the contact holes C with the metal. Then, CMP is performed to the silicon substrate 1 to flatten the surface of the substrate, thus forming a basic structure of the semiconductor device S10 including metal contacts 55 formed therein.

According to the thus configured semiconductor device S10 and its manufacturing method as well, ion implantation is performed to form the P well W1 and the N well W3 as well as the N well W2 so that any of the element isolation films 11a, 11b, 12a, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 10B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Eleventh Embodiment

Referring next to FIGS. 11A and 11B, the following describes the structure of an example semiconductor device S11 according to an eleventh embodiment and the procedure in the manufacturing method therefor. The semiconductor device S11 has the same structure as that of the semiconductor device S10 illustrated in FIGS. 10A and 10B, except that it includes an element isolation film 11a disposed at a P well W1 that extends close to the boundary BN between the P well W1 and an N well W2, and that it does not have the element isolation film 12a of the N well W2.

The thus configured semiconductor device S11 can be manufactured by the same procedure in the manufacturing process of the semiconductor device S10 illustrated in FIGS. 14-18 and 39-46, except that element isolation films 11a, 11b, and 12b illustrated in FIG. 11B are formed in the silicon substrate 1 at the above step discussed in the context of FIG. 14 (the element isolation film 12a is not formed), and so the duplicated descriptions are omitted.

According to the thus configured semiconductor device S11 and its manufacturing method as well, ion implantation is performed to form the P well W1 and the N well W3 as well as the N well W2 so that any of the element isolation films 11a, 11b, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 11B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Twelfth Embodiment

Referring next to FIGS. 12A and 12B, the following describes the structure of an example semiconductor device S12 according to a twelfth embodiment and the procedure in the manufacturing method therefor. The semiconductor device S12 has the same structure as that of the semiconductor device S10 illustrated in FIGS. 10A and 10B, except that it includes an element isolation film 12a disposed at an N well W2 that extends close to the boundary BN between a P well W1 and the N well W2, and that it does not have the element isolation film 11a of the P well W1.

The thus configured semiconductor device S12 can be manufactured by the same procedure in the manufacturing process of the semiconductor device S10 illustrated in FIGS. 14-18 and 39-46, except that element isolation films 11b, 12a, and 12b illustrated in FIG. 12B are formed in the silicon substrate 1 at the above step discussed in the context of FIG. 14 (the element isolation film 11a is not formed), and so the duplicated descriptions are omitted.

According to the thus configured semiconductor device S12 and its manufacturing method as well, ion implantation is performed to form the P well W1 and the N well W3 as well as the N well W2 so that any of the element isolation films 11b, 12a, and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 12B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Thirteenth Embodiment

Referring next to FIGS. 13A and 13B, the following describes the structure of an example semiconductor device S13 according to a third embodiment and the procedure in the manufacturing method therefor. The semiconductor device S13 has the same structure as that of the semiconductor device S10 illustrated in FIGS. 10A and 10B, except that it does not include the element isolation film 11a at the P well W1 and the element isolation film 12a at the N well W2.

The thus configured semiconductor device S13 can be manufactured by the same procedure in the manufacturing process of the semiconductor device S10 illustrated in FIGS. 14-18 and 39-46, except that element isolation films 11b and 12b illustrated in FIG. 13B are formed in the silicon substrate 1 at the above step discussed in the context of FIG. 14 (the element isolation films 11a and 12a are not formed), and so the duplicated descriptions are omitted.

According to the thus configured semiconductor device S13 and its manufacturing method as well, ion implantation is performed to form the P well W1 and the N well W3 as well as the N well W2 so that any of the element isolation films 11b and 12b has a portion that does not extend over (does not cover up) the boundary BN between the P well W1 (first well) and the N well W2 (second well). As a result, a part of the N well W3 juts out under the N well W2 (the part surrounded with the broken line frame W23 in FIG. 13B). This means that the connection part of the N wells W2 and W3 is enlarged (extended) compared with the conventional structure, and so the connection between the N well W2 and the N well W3 can be reinforced compared with the conventional structure. This can lower the resistance between the N wells in the triple-well structure, and can improve latch-up immunity.

Although features of the semiconductor devices and manufacturing methods according to the present invention have been described based on the embodiments, these are merely examples and are not limited to the above description. Embodiments can be modified variously as long as its gist is not changed. For instance, a person skilled in the art can replace various materials, exemplary process conditions, element structures, and structures of semiconductor devices described in the embodiments with their equivalents, and such replacement also is included in the scope of the present invention.

In the semiconductor devices S1 to S13 of the first through thirteenth embodiments, the element isolation films 11a, 11b, 12a, and 12b are formed so as to surround the formation area A1 of the N-type transistor Sn (first transistor) entirely in the plan view (A-A cross section), which is not a limiting example. That is, element isolation films 11a, 11b, 12a, and 12b as in the embodiments may be formed at the boundary BN between the N-type transistor Sn (first transistor) formation area A1 and the P-type transistor Sp (second transistor) formation area A2 (especially at a part requiring the connection reinforcement between the N well W3 and the N well W2). The element isolation films 11a, 11b, 12a, and 12b may be disposed continuously in the plan view or may be disposed in a distributed manner (a plurality of parts may be disposed in a linked manner with intervals therebetween).

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A semiconductor device comprising:
   a first transistor and a second transistor disposed in or on a silicon substrate;
   a first well disposed in a formation area of the first transistor, and a second well disposed in a formation area of the second transistor, wherein the second well surrounds the first well in a plan view of the silicon substrate; and
   a third well disposed under an entirety of the first well, but less than an entirety of the second well, and wherein the third well is electrically connected to the second well,
   wherein the semiconductor device does not include an element isolation structure including an element isolation film disposed in the silicon substrate between the first transistor and the second transistor, and wherein the first transistor is an N-type transistor, the second transistor is a P-type transistor, the first well is a P-well, the second well is an N-well, and the third well is an N-well.

2. The semiconductor device of claim 1, further comprising at least one of a source or drain region disposed at a boundary between the first well and the second well, or a silicide block film disposed above the boundary.

3. A semiconductor device comprising:
   a first transistor in a first well formed by implanting ions of a first type in a substrate;
   a second transistor in a second well formed by implanting ions of a second type in the substrate, the second well abutting and surrounding the first well in a plan view of the substrate to form a boundary therebetween;
   a third well formed by implanting ions of the second type in the substrate, the third well disposed under an entirety of the first well and extending under less than an entirety of the second well, lowering an electrical resistance of a connection between the third well and the second well; and
   a first element isolation structure in a surface of the substrate between the first transistor and the second transistor, wherein the first element isolation structure surrounds the first well, overlies the second well and does not extend over the boundary between the first well and the second well,
   wherein the third well extends under and not past the first element isolation structure overlying the second well.

4. The semiconductor device of claim 3, further comprising a silicide film disposed above the boundary.

5. The semiconductor device of claim 3, wherein the second well extends deeper into the substrate than the first well, increasing an area of the connection between the third well and the second well.

6. The semiconductor device of claim 3, further comprising a second element isolation structure overlying the first well and surrounding the first transistor, wherein the second element isolation structure does not extend over the boundary between the first well and the second well.

7. A semiconductor device comprising:
   an N-type transistor in a P-well in a substrate;
   a P-type transistor in an N-well in the substrate, the N-well abutting and surrounding the P-well in a plan view of the substrate to form a boundary therebetween;
   a deep N-well disposed in the substrate under the entire P-well and extending under less than an entirety of the N-well, lowering an electrical resistance of a connection between the deep N-well and the N-well;
   a first element isolation structure in a surface of the substrate between the N-type transistor and the P-type transistor, wherein the first element isolation structure surrounds the P-well, overlies the N-well and does not extend over the boundary between the P-well and the N-well; and
   a silicide film disposed above the boundary,
   wherein the deep N-well extends under and not past the first element isolation structure overlying the N-well.

8. The semiconductor device of claim 7, further comprising at least one of a source or drain region disposed at the boundary between the N-well and the P-well, and underlying the silicide film disposed above the boundary.

9. The semiconductor device of claim 7, wherein the N-well extends deeper into the substrate than the P-well, increasing an area of the connection between the deep N-well and the N-well.

10. The semiconductor device of claim 7, wherein the P-well comprises Boron ions implanted at a first energy, and the N-well comprises Phosphorous ions implanted at a second energy greater than the first energy.

11. The semiconductor device of claim 7, further comprising a second element isolation structure overlying the P-well and surrounding the N-type transistor, wherein the second element isolation structure does not extend over the boundary between the N-well and the P-well.

12. The semiconductor device of claim 11, wherein the deep N-well extends under first element isolation structure overlying the N-well.

* * * * *